(12) United States Patent
Ishikawa et al.

(10) Patent No.: US 7,968,466 B2
(45) Date of Patent: Jun. 28, 2011

(54) FABRICATION PROCESS OF A SEMICONDUCTOR DEVICE TO FORM ULTRAFINE PATTERNS SMALLER THAN RESOLUTION LIMIT OF EXPOSURE APPARATUS

(75) Inventors: Kenji Ishikawa, Kawasaki (JP); Hideharu Shido, Kawasaki (JP); Takeo Nagata, Kawasaki (JP); Teruo Kurahashi, Kawasaki (JP); Yasuyoshi Mishima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 767 days.

(21) Appl. No.: 11/945,547

(22) Filed: Nov. 27, 2007

(65) Prior Publication Data
US 2008/0124933 A1    May 29, 2008

(30) Foreign Application Priority Data

Nov. 29, 2006    (JP) ................................. 2006-322463

(51) Int. Cl.
*H01L 21/311* (2006.01)
(52) U.S. Cl. .......... 438/696; 257/E21.444; 257/E21.453
(58) Field of Classification Search .................. 438/696; 257/E21.444, E21.453
See application file for complete search history.

(56) References Cited

U.S. PATENT DOCUMENTS

| 5,290,728 | A | * | 3/1994 | Sato ............................... 438/301 |
| 5,828,120 | A | * | 10/1998 | Ishikawa ........................ 257/499 |
| 6,128,214 | A |   | 10/2000 | Kuekes et al. |
| 6,256,767 | B1 |   | 7/2001 | Kuekes et al. |
| 6,271,573 | B1 | * | 8/2001 | Suguro ........................... 257/407 |
| 6,314,019 | B1 |   | 11/2001 | Kuekes et al. |

FOREIGN PATENT DOCUMENTS

JP    2002-280388 A    9/2002

OTHER PUBLICATIONS

Korean Office Action dated Dec. 12, 2008, issued in corresponding Korean Patent Application No. 10-2007-0122289.

* cited by examiner

*Primary Examiner* — A. Sefer
*Assistant Examiner* — Allen L Parker
(74) *Attorney, Agent, or Firm* — Westerman, Hattori, Daniels & Adrian, LLP

(57) ABSTRACT

A method for fabricating an electron device on a substrate includes the steps of forming a dummy film over the substrate such that the dummy film covers a device region of the substrate and an outer region of the substrate outside the device region, forming a dummy pattern by patterning the dummy film such that the dummy pattern has a first height in the device region and a second height smaller than the first height in the outer region, forming another film over the substrate such that the film covers the dummy pattern in the device region and in the outer region with a shape conformal to a cross-sectional shape of the dummy pattern, and applying an anisotropic etching process acting generally perpendicularly to the substrate such that a surface of the substrate is exposed in the device region and in the outer region.

10 Claims, 32 Drawing Sheets

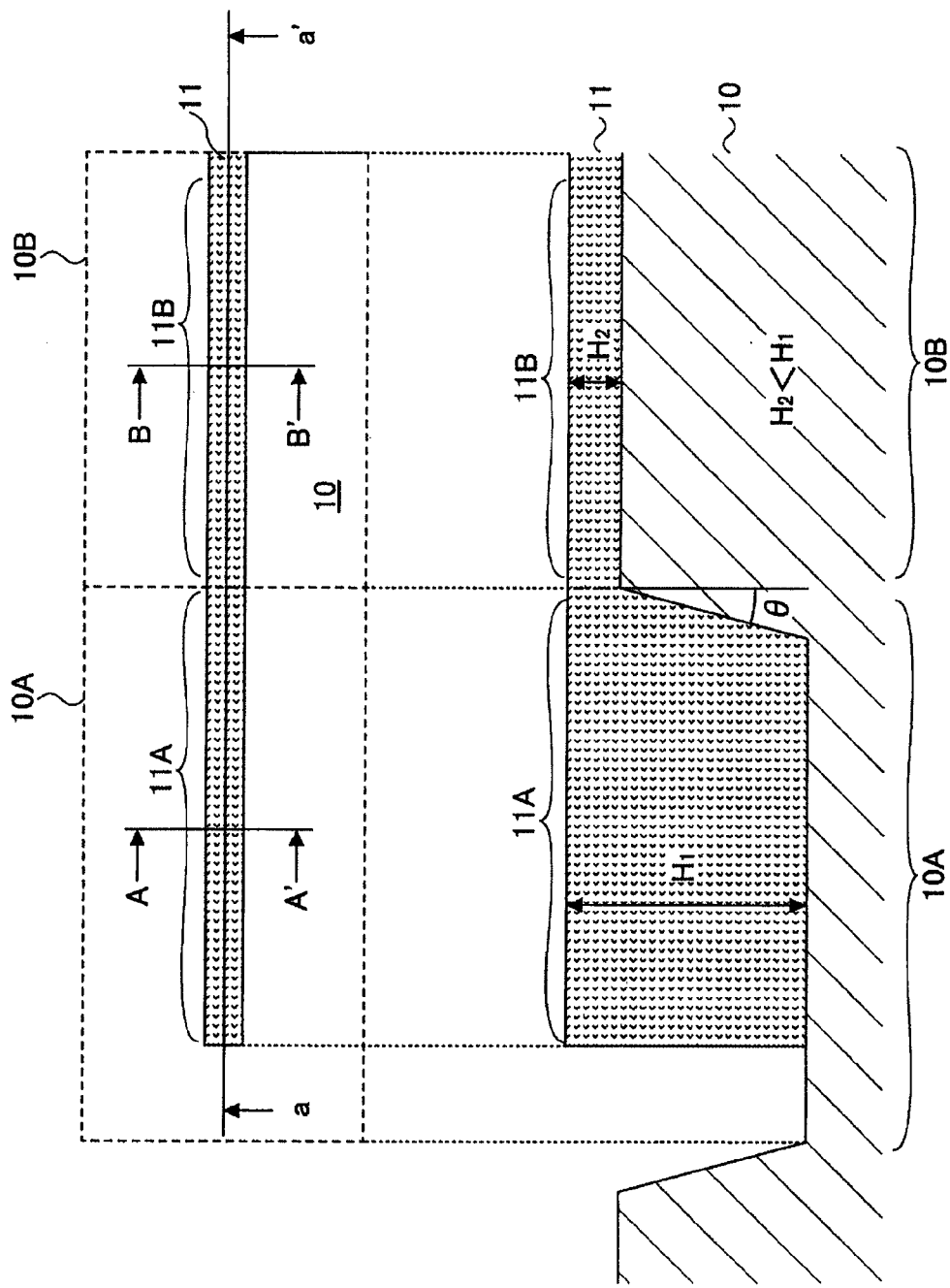

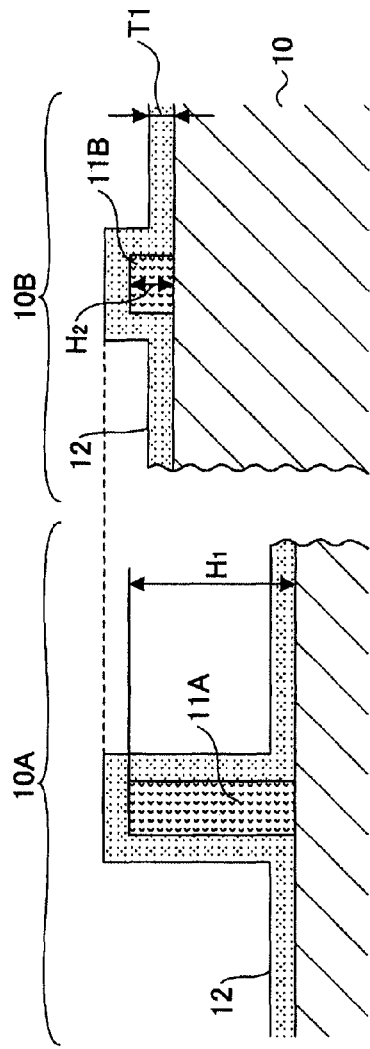
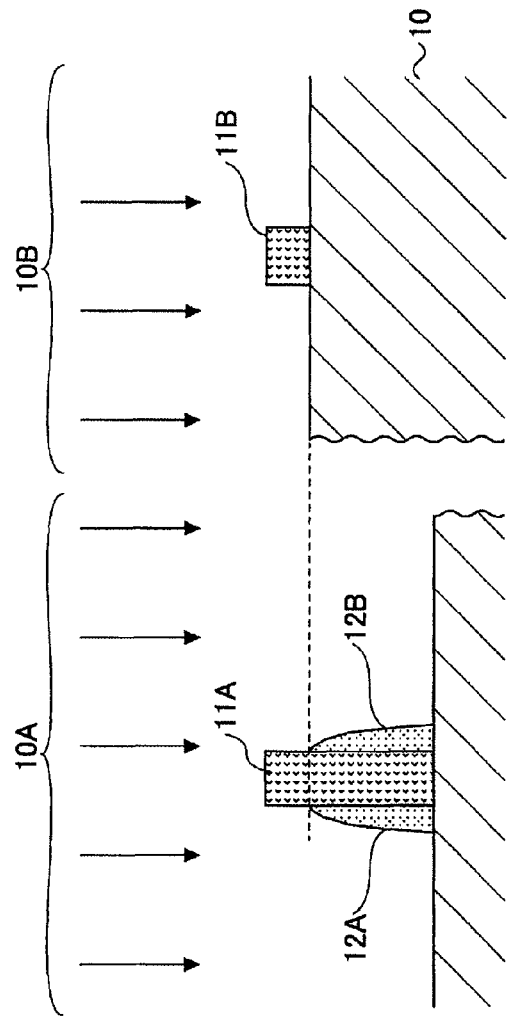
FIG.1C
FIG.1D

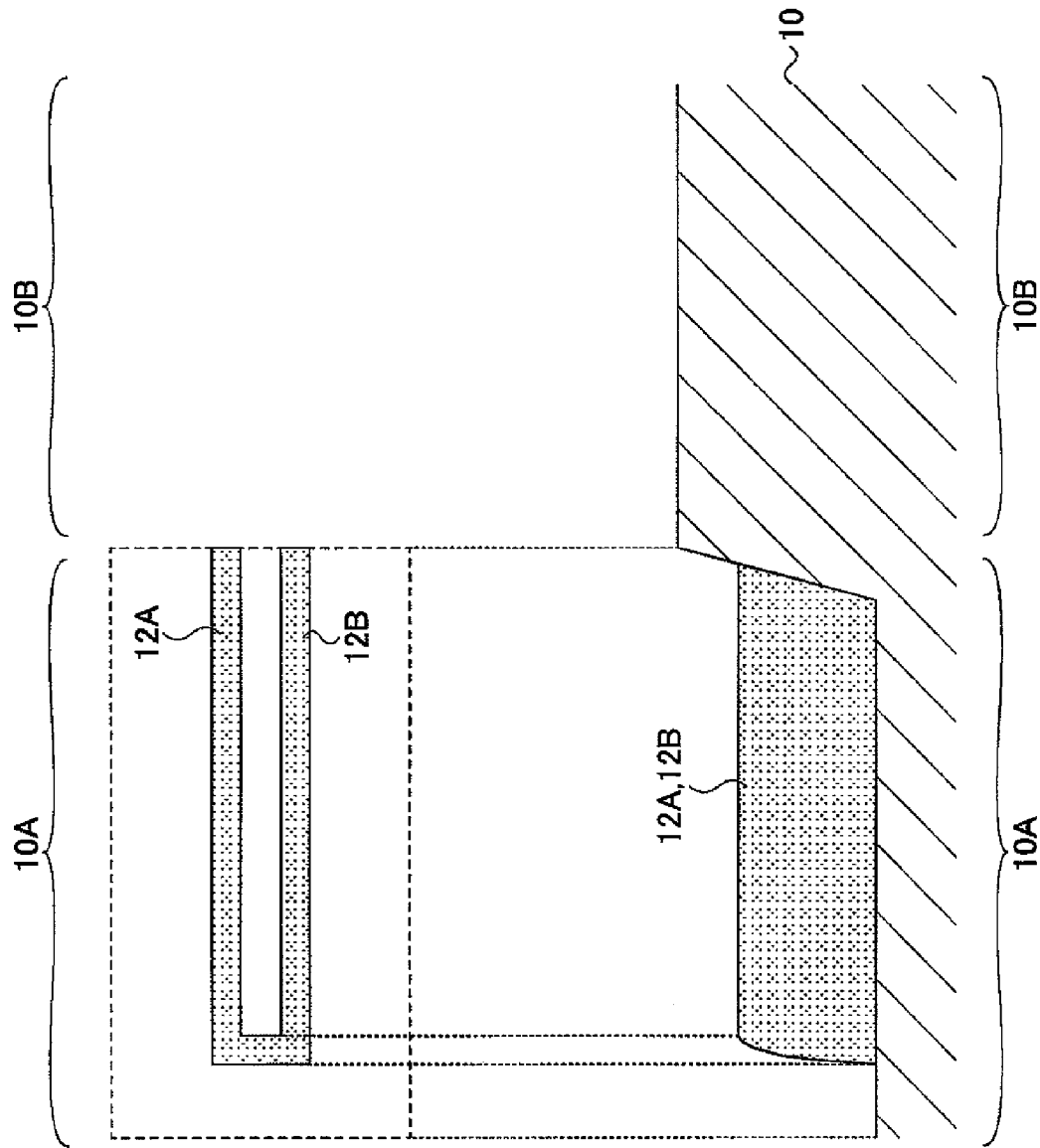

$H_1 > H_2$

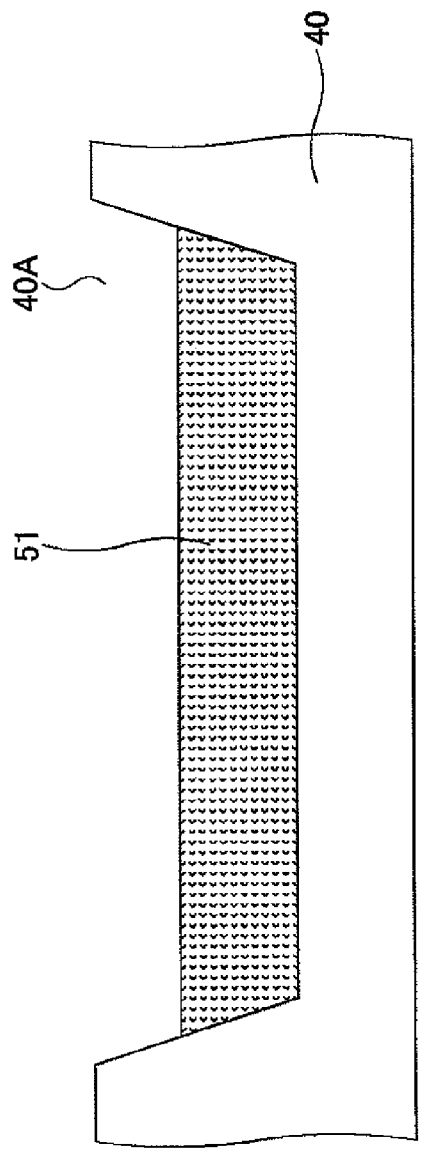
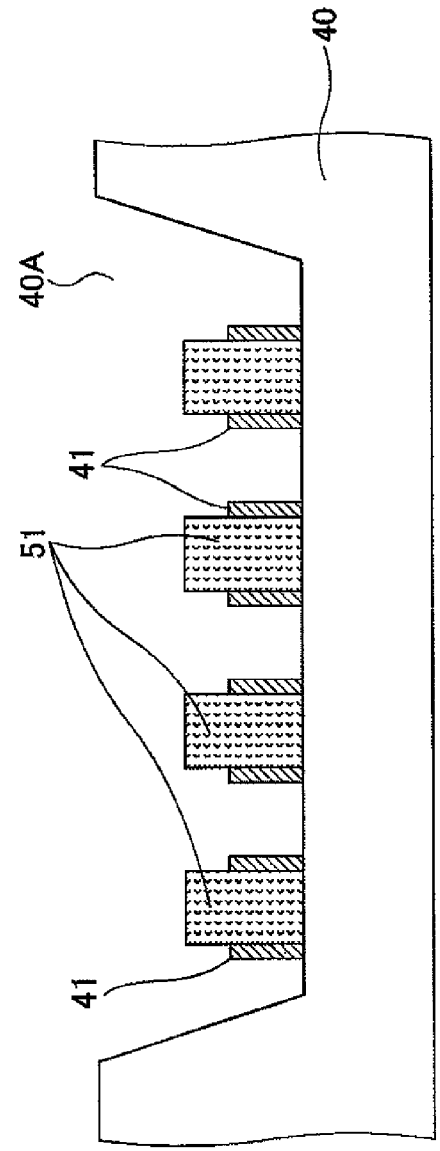

$H_1 > \delta > H_2$

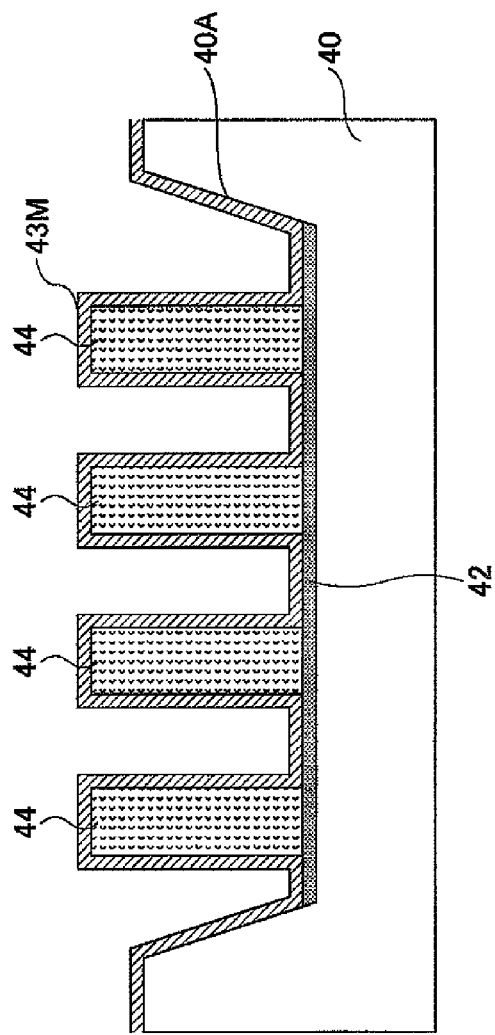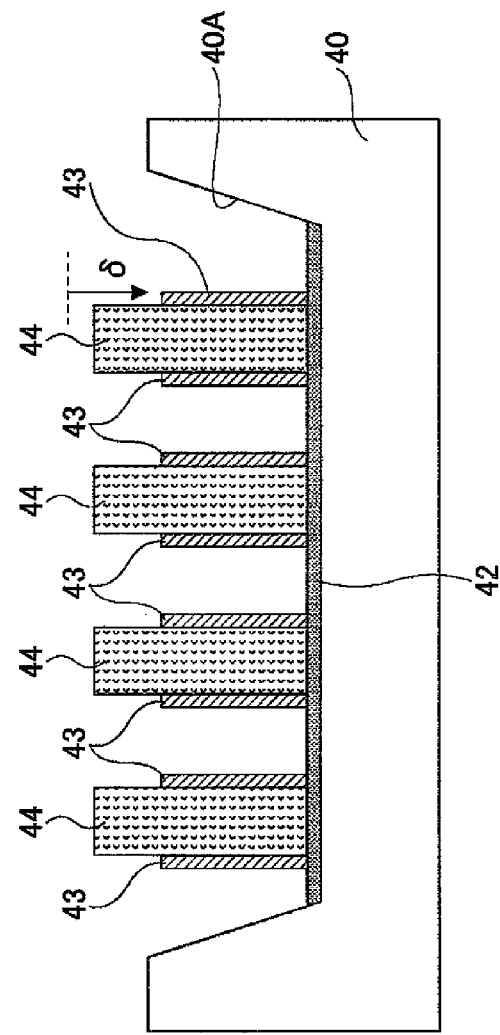

US 7,968,466 B2

FABRICATION PROCESS OF A SEMICONDUCTOR DEVICE TO FORM ULTRAFINE PATTERNS SMALLER THAN RESOLUTION LIMIT OF EXPOSURE APPARATUS

CROSS-REFERENCE TO RELATED APPLICATION

The present application is based on Japanese priority application No. 2006-322463 filed on Nov. 29, 2006, the entire contents of which are hereby incorporated by reference.

TECHNICAL FIELD

The present invention generally relates to fabrication process of a semiconductor device.

BACKGROUND

In electron devices such as semiconductor devices, it is now becoming possible, as a result of progress of exposure technology, to produce ultrafine electron devices such as ultrafine semiconductor devices with a pattern width of several ten nanometers or less.

On the other hand, when attempt is made to advance this trend of miniaturization furthermore for mass-production of further miniaturized semiconductor devices, huge investment becomes necessary for steppers, reticles, and the like, and there arises the problem of sharp increase of production cost of the electron devices.

SUMMARY

According to various disclosures of the present invention, the fabrication process of semiconductor device according to the present invention includes the steps of forming a dummy pattern with different heights and forming a sidewall film upon the dummy pattern.

BRIEF DESCRIPTION OF THE DRAWINGS

FIGS. 1A-1H are diagrams explaining the principle of the present invention;

FIGS. 11A and 11B are further diagrams explaining the fabrication process of the cross-bar apparatus of FIGS. 8A and 8B;

FIGS. 17A and 17B are further diagrams explaining the fabrication process of the cross-bar apparatus of FIGS. 8A and 8B.

DETAILED DESCRIPTION OF THE INVENTION

[Principle]

Figures 1E, 1F:
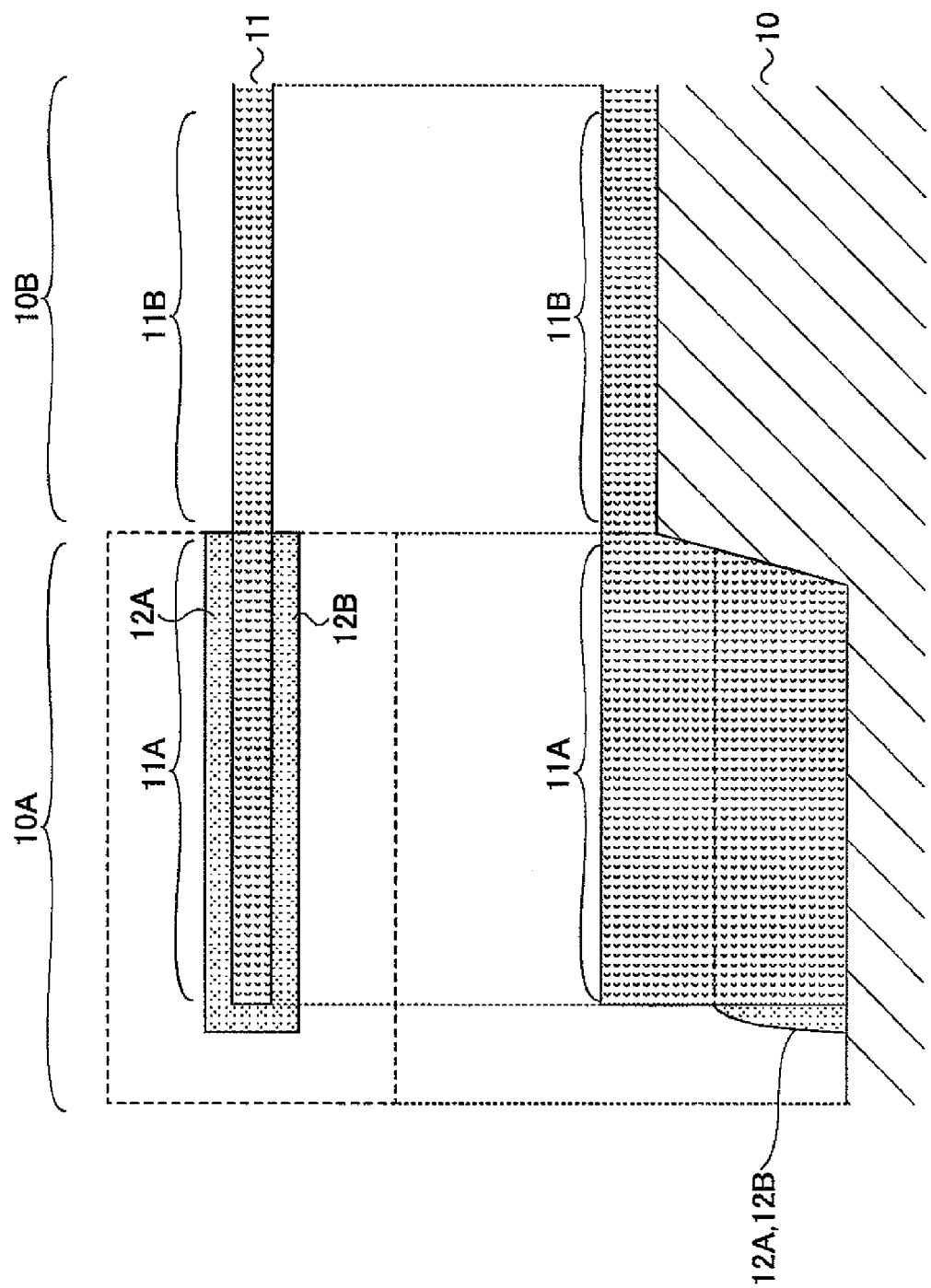

First, the principle of the present invention will be described with reference to FIGS. 1A-1H.

Referring to FIGS. 1A and 1B, there is formed a depression on a substrate 10 surrounded by a sloped surface 1A, and a dummy pattern 11 having a flat surface is formed on the substrate 10 from the foregoing region 10A to a region 10B outside thereof.

Because the region 10A is formed with the depression surrounded with the sloped surface, a dummy pattern part 11A of the dummy pattern 11 extending in the region 10A has a first film thickness, and hence a height $H_1$, while a dummy pattern part 11B that extends over the region 10B has a second, smaller film thickness, and thus, a smaller height $H_2$. Here, it should be noted that FIG. 1A is a plan view of the substrate 10, while FIG. 1B is a schematic diagram including a cross-sectional view of the dummy pattern part 11A taken along a line A-A' in FIG. 1A and a cross-sectional view of the dummy pattern part 11B taken along a line B-B' in FIG. 1A.

Next, in the step of FIG. 1C, a film 12 is formed uniformly on the structure of FIGS. 1A and 1B with a shape conformal to the cross-sectional shape of the dummy pattern parts 11A and 11B with a film thickness T1. In FIG. 1C, it should be noted that the part showing the region 10A represents the cross-section taken along a line A-A' shown in FIG. 1A, while the part showing the region 10B represents the cross-section taken along a line B-B' of FIG. 1A.

In the case the film 12 is formed with the film thickness $T_1$, it becomes possible to cause the sidewall film of the dummy pattern part 11B to vanish in the region 10B when the film 12 is etched back with an anisotropic etching process that acts generally perpendicularly to a principal surface of the substrate 10 with an etching depth larger than a sum of the height $H_2$ and the film thickness $T_1$. Thus, with the present invention, the film thickness $H_1$ is set larger than the sum of the film thickness $H_2$ and the film thickness $T_1$. The film thickness $H_2$ may be zero.

On the other hand, when the depth of the anisotropic etching is designated as $T_2$, and when the angle of the sloped surface with regard to the vertical direction of the substrate 10, and hence with regard to the direction in which the anisotropic etching works, is designated as θ (see FIG. 1B), the effective etching amount δ needed for removing the film 12 formed on such a sloped surface with the film thickness T1 completely by the anisotropic etching acting perpendicularly to the substrate 10 is given as $$\delta \approx T_1/\sin\theta.$$

Thus, in the case the angle θ is 0 degree, the sloped surface becomes a vertical surface, and the effective etching amount δ needed to achieve this becomes infinite. On the other hand, in the case the angle θ is 90 degrees, and hence in the case the sloped surface is a flat surface, the effective etching amount δ becomes equal to the thickness $T_1$. Further, at the angle θ of 60 degrees, the effective etching amount δ needed for removing the film 12 completely becomes about 2 times as large as the film thickness $T_1$.

Thus, in order to remove the film 12 completely, not only from the dummy pattern part 11B but also from the sloped surface of the depression with such a structure by way of the anisotropic etching process acting substantially perpendicularly to the substrate 10, there is a need that the height $H_1$ of the dummy pattern part 11A satisfies the relationship $$H_1 > H_2 + T_1/\sin\theta$$

with regard to the height $H_2$ of the dummy pattern part 11B and with regard to the angle θ. Here, it should be noted that the height $H_2$ of the dummy pattern part 11B may be zero.

Next, in the step of FIG. 1D, an anisotropic etching process acting generally perpendicularly to the surface of the substrate 11 is applied to the structure of FIG. 1C, and the film 12 is removed with the amount exceeding the height $H_2$ of the dummy pattern part 11B.

During this process, the film 12 is removed also from the sloped surface surrounding the region 10A, and as a result, the film 12 is removed completely from the region 10B as showing in FIG. 1D, while in the region 10A, the film 12 remains as sidewall patterns 12A and 12B of the dummy pattern part 11A.

FIGS. 1E and 1F show respectively a plan view and a cross-sectional view of the structure of FIG. 1D taken along the dummy pattern 11.

Referring to FIGS. 1E and 1F, the patterns 12A and 12B are formed along the sidewall surfaces of the dummy pattern part 11A and the patterns 12A and 12B are in continuation with each other at an end part of the dummy pattern 11A. On the other hand, at the other end of the dummy pattern 11A corresponding to the boundary between the region 10A and the region 10B, it can be seen that the patterns 12A and 12B are disconnected and that the patterns 12A and 12B are vanished from the region 10B.

Next, in the step of FIGS. 1G and 1H, the dummy pattern 11 is removed selectively, leaving the patterns 12A and 12B in the region 10A. Here, it should be noted that FIG. 1G shows the resultant structure in a plan view while FIG. 1H shows the same structure in a side view.

Thus, with the present invention, in which a stepped structure is formed in the dummy pattern as shown in FIGS. 1A and 1B and the sidewall patterns 12A and 12B are left only in the desired region 10A, the sidewall patterns 12A and 12B no longer form a circuitous pattern, and it becomes possible to form various electron devices by using the patterns 12A and 12B.

Figure 2:
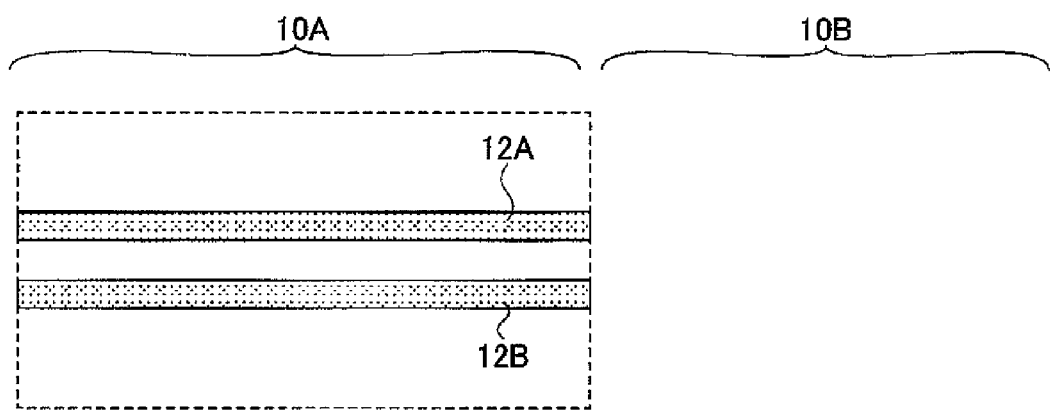
FIG. 2 is another diagram explaining the principle of the present invention.

While the patterns 12A and 12B are joined with each other at an end part thereof with the construction of FIGS. 1G and 1H, this is caused only because the dummy pattern 11A is terminated in the region 10A, and it becomes possible to form the patterns 12A and 12B in the form of two, independent patterns as shown in FIG. 2, by forming the dummy pattern 11A so as to extend continuously throughout the region 10A.

It should be noted that the patterns 12A and 12B thus formed are miniaturized beyond the resolution limit at the time of formation of the dummy pattern 11, and thus, the present invention enables formation of such ultra-fine patterns easily and efficiently.

While such ultra-fine patterns 12A and 12B can be used themselves for the functional part of an electron devices such as a semiconductor device, the patterns 12A and 12B may also be used for a patterning mask for forming miniaturized functional part of electron devices.

In FIGS. 1A and 1B, it is sufficient that the height $H_1$ of the dummy pattern part 11A is larger than the height $H_2$ of the dummy pattern part 11B with the present invention, and thus, formation of depression in the region 10A is not a requisite condition.

Figure 3:
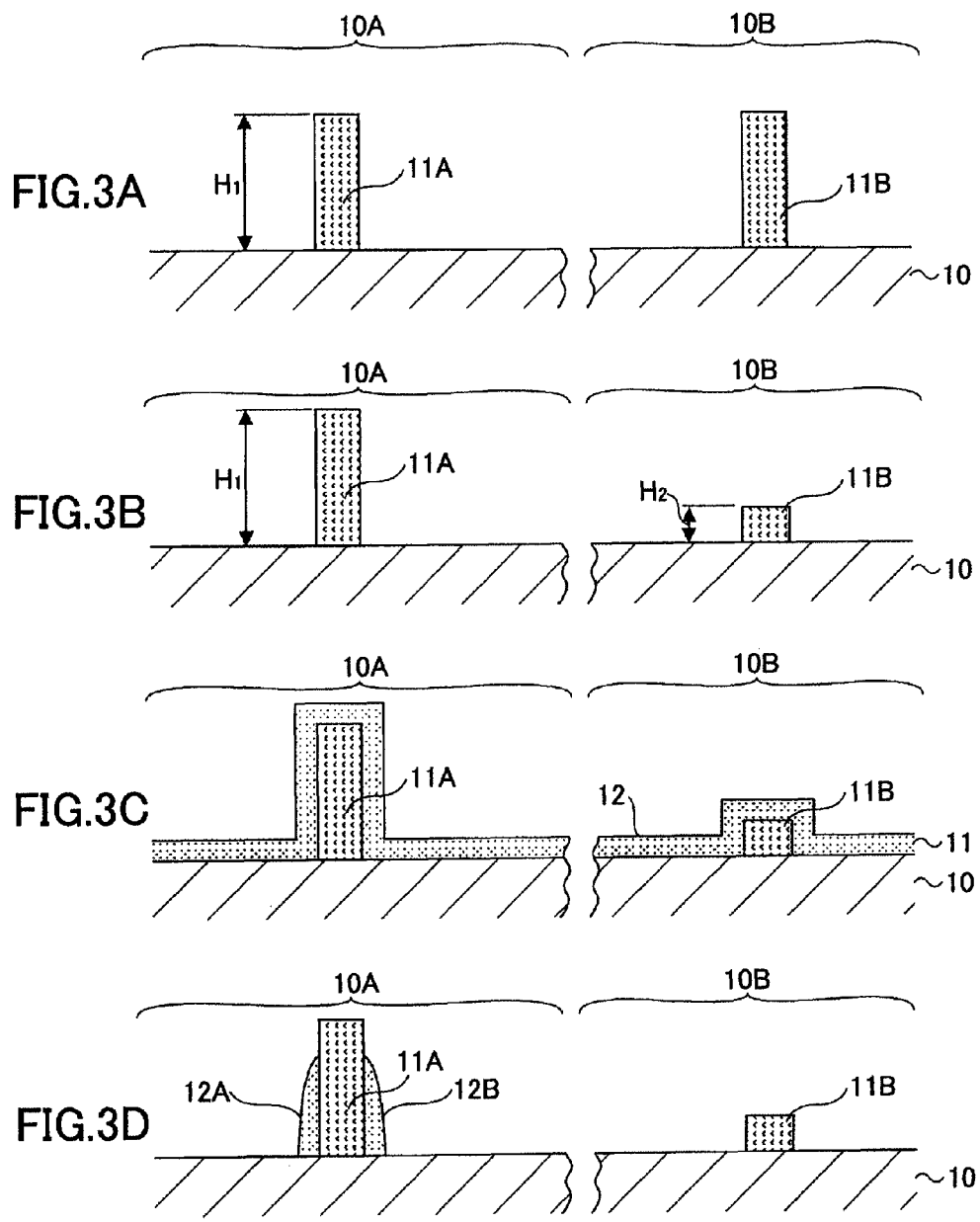
FIGS. 3A-3D are further diagrams explaining the principle of the present invention.
Figure 4:
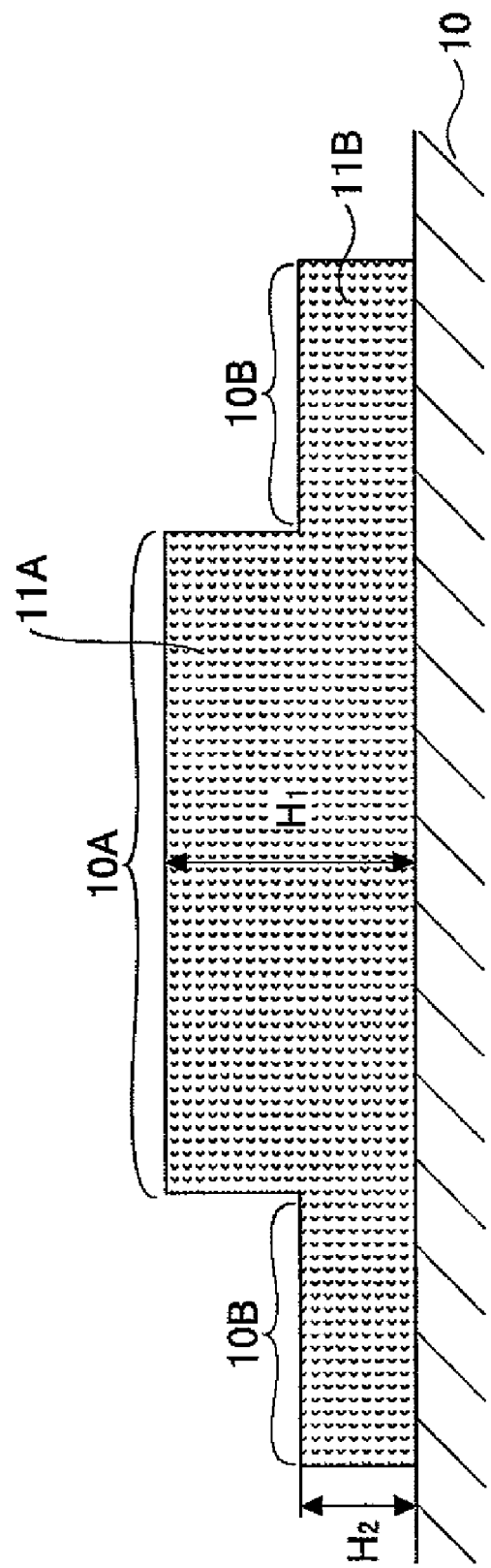
FIG. 4 is a lateral cross-sectional diagram of the dummy pattern corresponding to the process of FIG. 3B.

Thus, as shown in FIG. 3A, the present invention may be implemented by forming the dummy pattern 11 on a flat substrate 10 with a height $H_1$ and reduce the height of the dummy pattern part 11B to the height $H_2$ in the step of FIG. 3B, such that the dummy pattern 11 includes the pattern parts 11A and 11B as shown in the side view of FIG. 4.

With this approach, the film 12 is formed on the structure of FIG. 3B in the step of FIG. 3C with a shape conformal to the cross-sectional shape of the dummy pattern parts 11A and 11B.

Further, in the step of FIG. 3D, an anisotropic etching process is conducted similarly to the step of FIG. 1D such that the film 12 vanishes from the region 10B and such that the film 12 remains only in the region 10A as the sidewall films 12A and 12B of the dummy pattern part 11A.

In the present invention, it should be noted that the height $H_2$ of the dummy pattern part 11B may be zero when a sloped surface is provided at the boundary between the region 10A and the region 10B.

FIRST EMBODIMENT

Figure 5A:
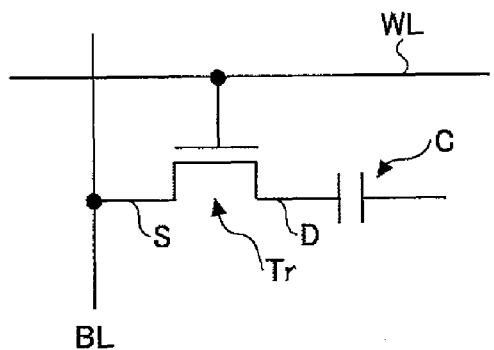
FIGS. 5A and 5B are diagrams showing the constitution of a DRAM according to a first embodiment of the present invention.
Figure 5B:
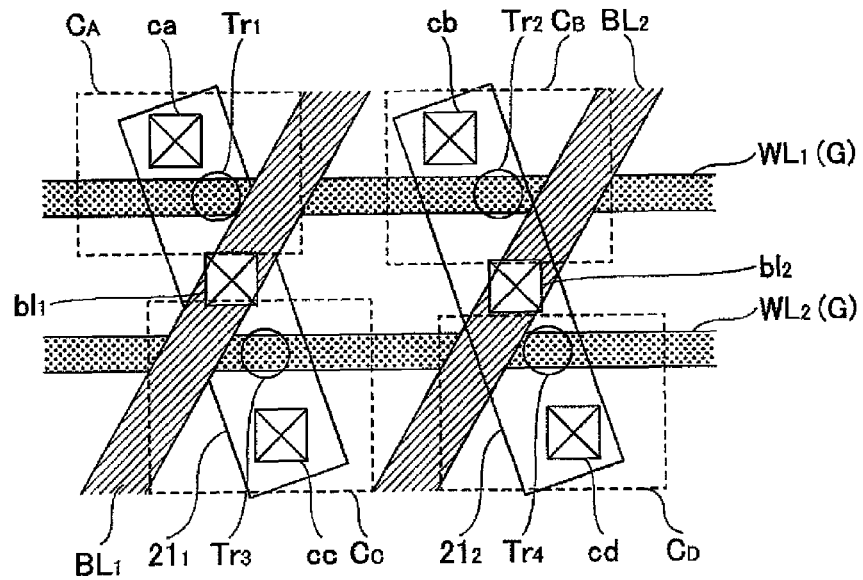

FIGS. 5A and 5B show the construction of a DRAM or FeRAM (ferroelectric memory) of 1T1C structure according to a first embodiment of the present invention, wherein it should be noted that FIG. 5A shows an equivalent circuit diagram for one cell of the DRAM or FeRAM, while FIG. 5B shows four cells thereof in a plan view. While the following explanation is made for a DRAM, the present embodiment is applicable also to FeRAMs.

Referring to FIG. 5A, the gate electrode of the memory cell transistor Tr is connected to a word line WL in the DRAM of illustrated example, a source electrode S is connected to a bit line BL and a drain electrode D is connected to a memory cell capacitor C.

Referring to the plan view of FIG. 5B, device regions $21_1$ and $21_2$ each corresponding to two cells are formed on a silicon substrate not illustrated, and a pair of word lines $WL_1$ and $WL_2$ functioning also for a gate electrode G are formed in parallel with each other so as to cross the device region 21.

Thus, at the intersection of the device region $21_1$ and the word line $WL_1$, there is formed a first memory cell transistor $Tr_1$, while at the intersection of the device region $21_2$ and the word line $WL_1$, there is formed a second memory cell transistor $Tr_2$. Further, at the intersection of the device region $21_1$ and the word line $WL_2$, there is formed a third memory cell transistor $Tr_3$, while at the intersection of the device region $21_2$ and the word line $WL_2$, there is formed a second memory cell transistor $Tr_4$.

Further, in the device regions $21_1$ and $21_2$, there are provided memory cell capacitors CA, CB, CC and CD in electrical contact with respective drain regions D of the first through fourth memory cell transistors $Tr_1$-$Tr_4$ via respective contact plugs ca, cb, cc and cd, a pair of bit lines BL1 and BL2 are formed further so as to cross the device regions $21_1$ and $21_2$ obliquely. Here, the bit line $BL_1$ is connected to a common drain region D of the transistors $Tr_1$ ad $Tr_3$ through a contact plug $bl_1$, while the bit line $BL_2$ is connected to a common drain region D of the transistors $Tr_2$ and $Tr_4$ through a contact plug $bl_2$.

Hereinafter, the fabrication process of the DRAM of FIGS. 5A and 5B will be described.

Figure 6A:
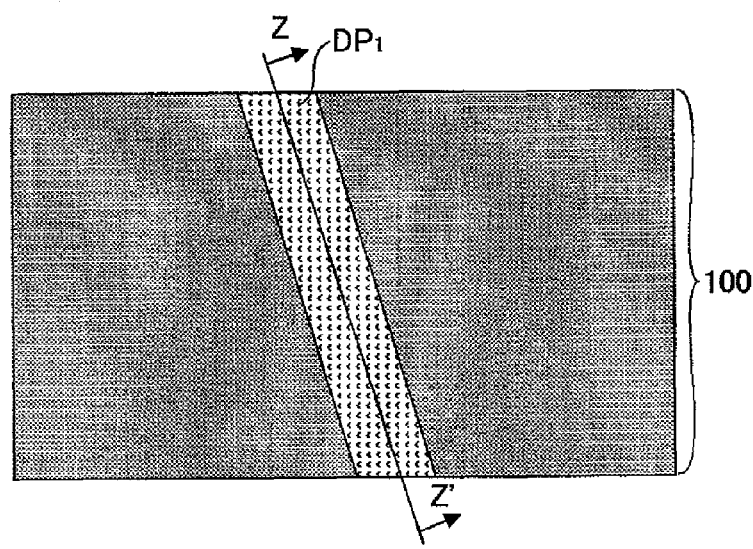
FIGS. 6A-6W are diagrams explaining the fabrication process of the DRAM of the first embodiment of the present invention.
Figure 6B:
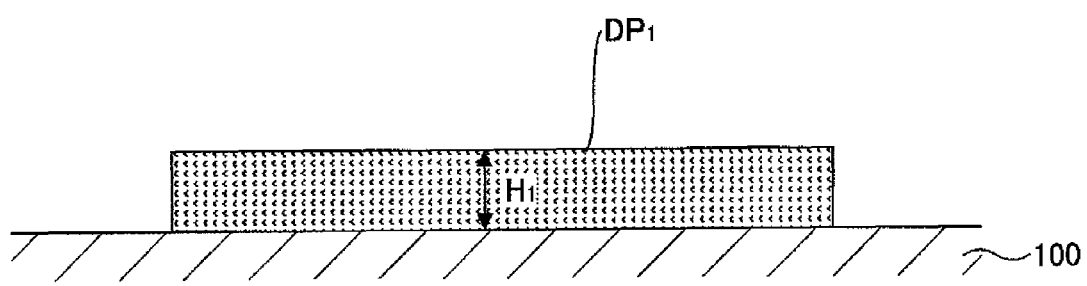

Referring to FIG. 6A, a dummy pattern $DP_1$ is formed on a silicon substrate 100 with a uniform film thickness $H_1$ as shown in FIG. 6B so as to define the edge part of the device regions $21_1$ and $21_2$. Here, it should be noted that FIG. 6B shows the dummy pattern $DP_1$ formed with the process of FIG. 6A in a cross-sectional view taken along a line Z-Z'.

Figure 6C:
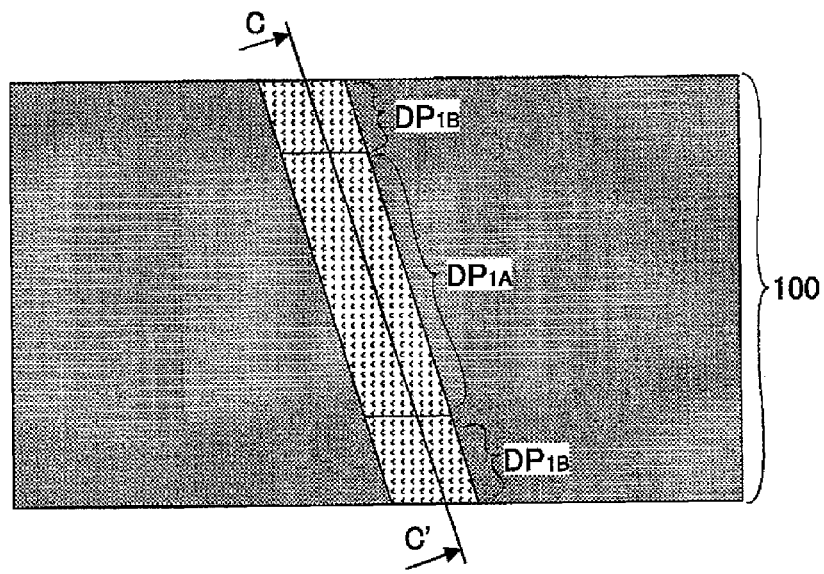
Figure 6D:
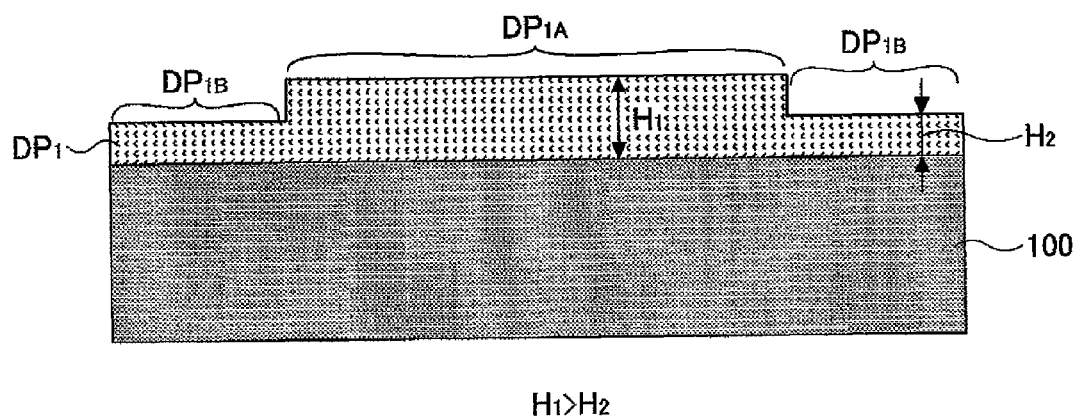

Next, in the step of FIG. 6C, the thickness, and hence the height $H_2$, of a dummy pattern part $DP_{1B}$ extending over the silicon substrate part to be used for the device isolation region is reduced to the foregoing height $H_2$ with regard to the height $H_1$ of the dummy pattern part $DP_{1A}$ extending over the silicon substrate 100 as shown in the cross-sectional view of FIG. 6D. Here, it should be noted that FIG. 6C is a cross-sectional view taken along a line C-C' of FIG. 6B.

Figure 6E:
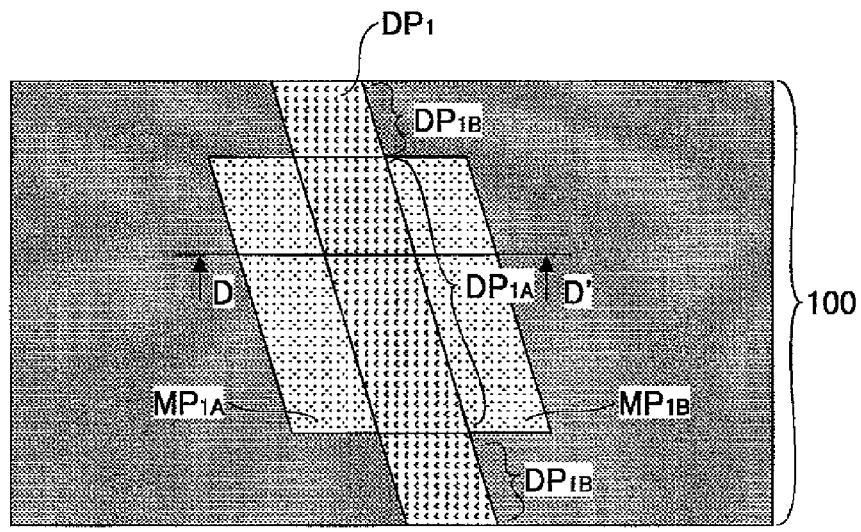
Figure 6F:
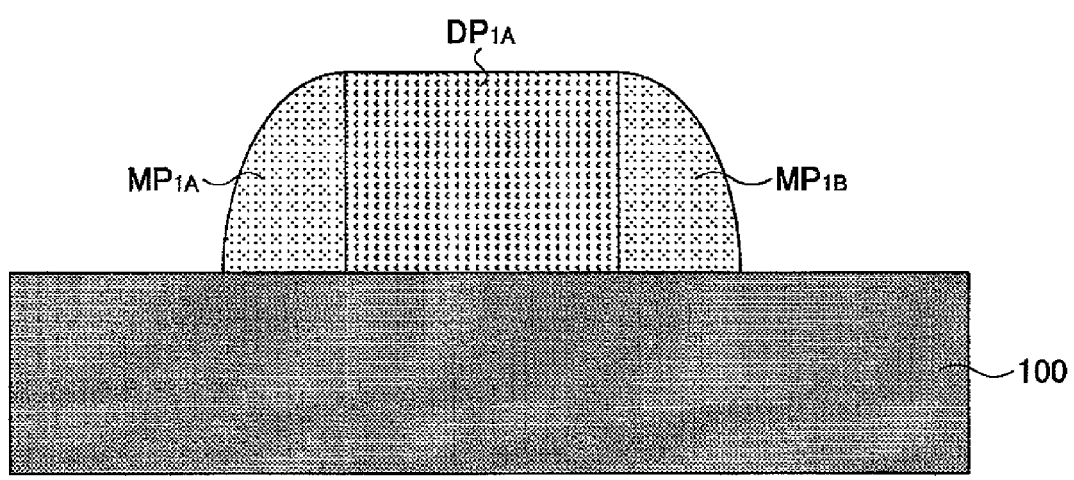

Next, in the step of FIG. 6E, a film that having etching selectivity with regard to silicon such as an SiN film is deposited on the structure of FIGS. 6C and 6D, and sidewall film patterns $MP_{1A}$ and $MP_{1B}$ are formed at both lateral sides of the dummy pattern part $DP_{1A}$ as shown in FIG. 6F similarly to the step of FIG. 3D by applying a dry etching process acting generally perpendicularly to the silicon wafer 100. Here, it should be noted that FIG. 6F is a cross-sectional view taken along a line D-D' of FIG. 6E.

Figure 6G:
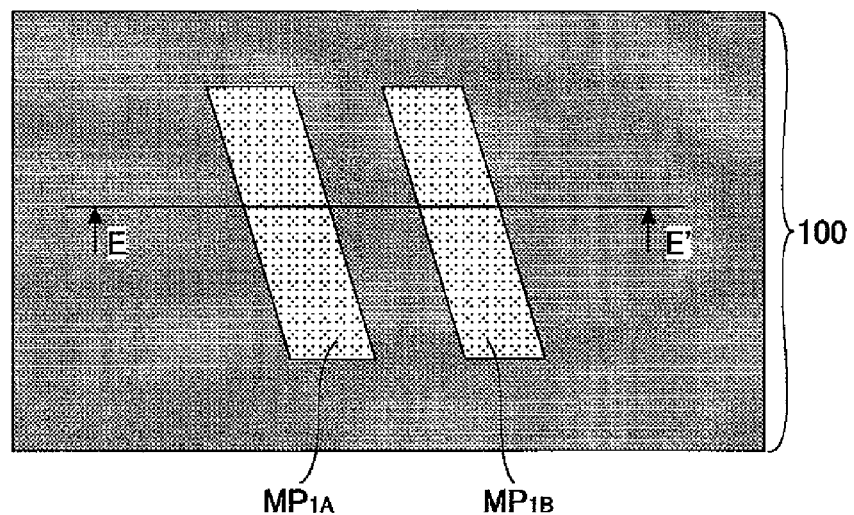
Figure 6H:
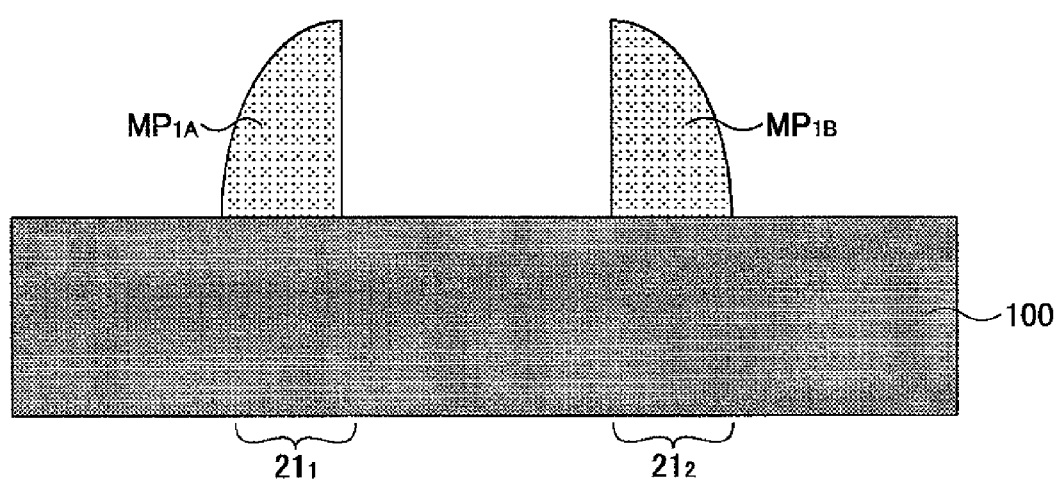

Next, in the process of FIG. 6G, the dummy pattern DP1 is removed selectively with regard to the sidewall film patterns $MP_{1A}$ and $MP_{1B}$. When the dummy pattern $DP_1$ is formed by a metal such as Al, for example, it should be noted that the dummy pattern $DP_1$ can be etched easily with regard to SiN constituting the sidewall film patterns $MP_{1A}$ and $MP_{1B}$ or to the silicon substrate 100. As a result of the selective etching process of FIG. 6G, there is obtained a structure as shown in FIG. 6H in which the SiN patterns $MP_{1A}$ and $MP_{1B}$ are formed on the silicon substrate 100 respectively in correspondence to the device regions $21_1$ and $21_2$. Here, it should be noted that FIG. 6H is a cross-sectional view diagram of FIG. 6G taken along a line E-E'.

Figure 6I:
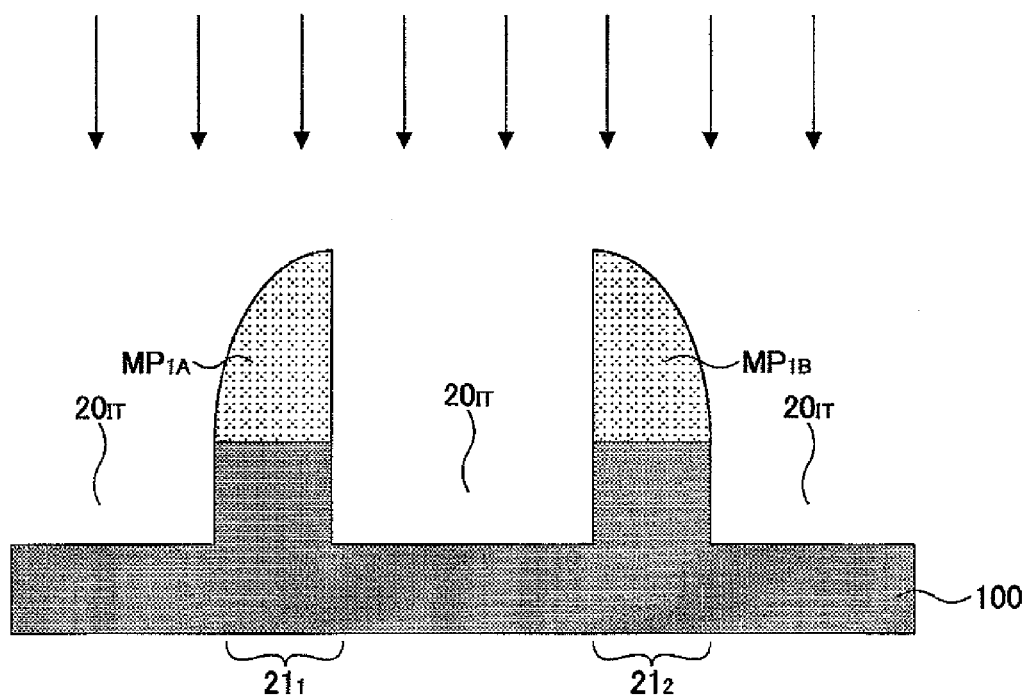

Next, in the step of FIG. 6I, the structure of FIG. 6H is subjected to a dry etching process while using the SiN patterns $MP_{1A}$ and $MP_{1B}$ as a mask, and with this, a device isolation trench $20_{IT}$ is formed around the device regions $21_1$ and $21_2$.

Figure 6J:
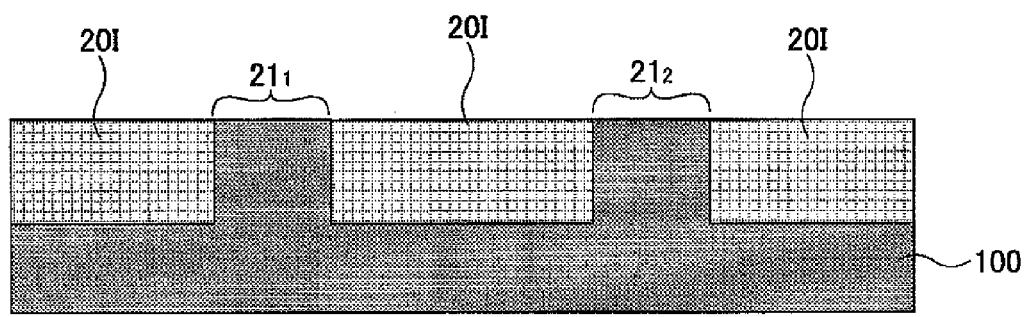

Further, in the step of FIG. 6J, the silicon region is subjected to a thermal oxidation process while leaving the SiN patterns $MP_{1A}$ and $MP_{1B}$ as they are, and the SiN patterns $MP_{1A}$ and $MP_{1B}$ are removed in the step of FIG. 6I. Further, the device isolation trench $20_{IT}$ is filled with a silicon oxidation film 20I, wherein the silicon oxide film $20_{IT}$ thus formed constitutes a device isolation structure.

Figure 6K:
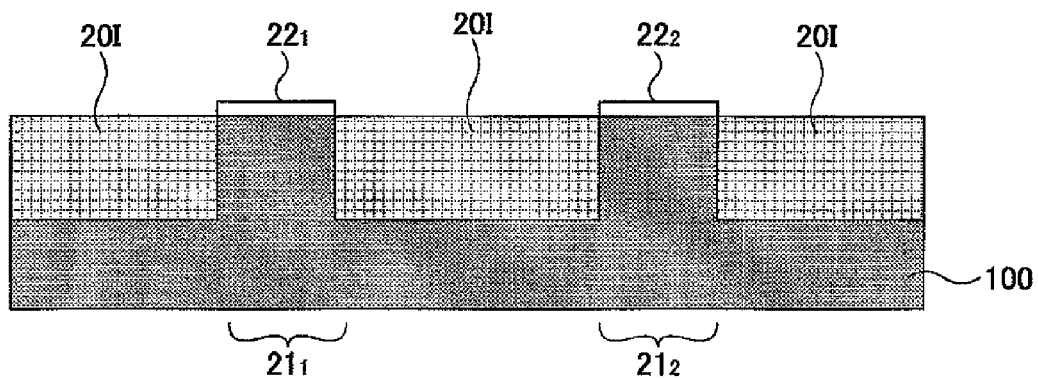
Figure 6L:
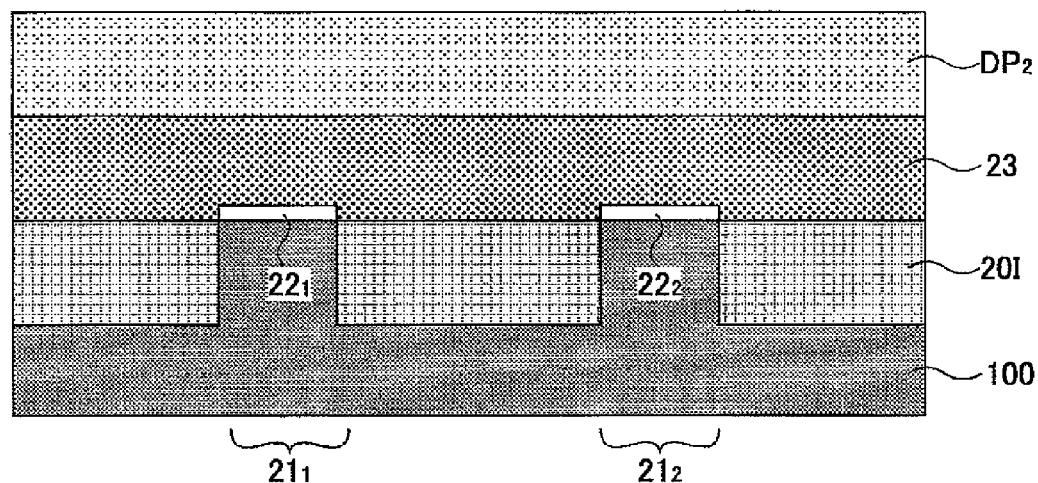

Next, in the step of FIG. 6K, gate insulation films $22_1$ and $22_2$ are formed on the surface of the device regions $21_1$ and $21_2$ with a known method, and a polysilicon film 23 is deposited in the step of FIG. 6L on the structure of FIG. 6K for formation of the gate electrode, such that the polysilicon film 23 covers the gate insulation films $22_1$ and $22_2$.

Here, it is also possible to use a material other than polysilicon for the gate electrode. In such a case, the gate electrode may be formed by first forming a dummy gate electrode pattern by using polysilicon and subsequently replacing the dummy polysilicon gate electrode pattern with another material.

Figure 6M:
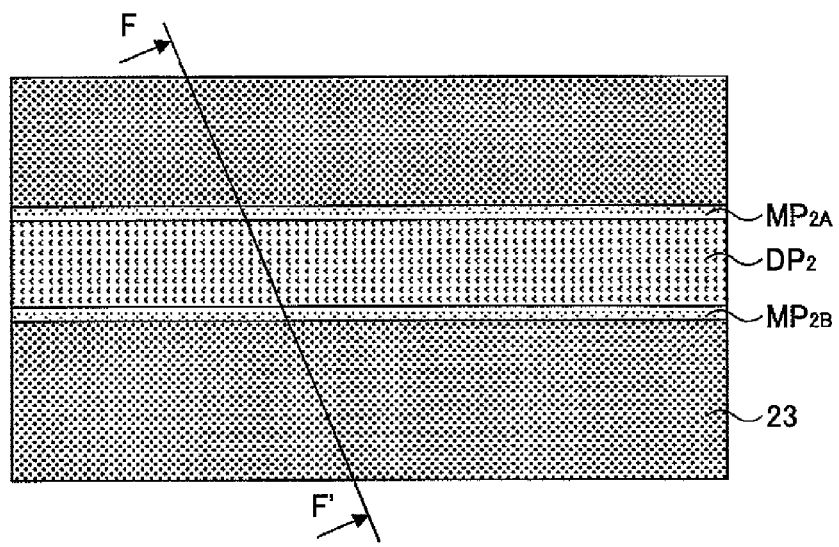
Figure 6N:
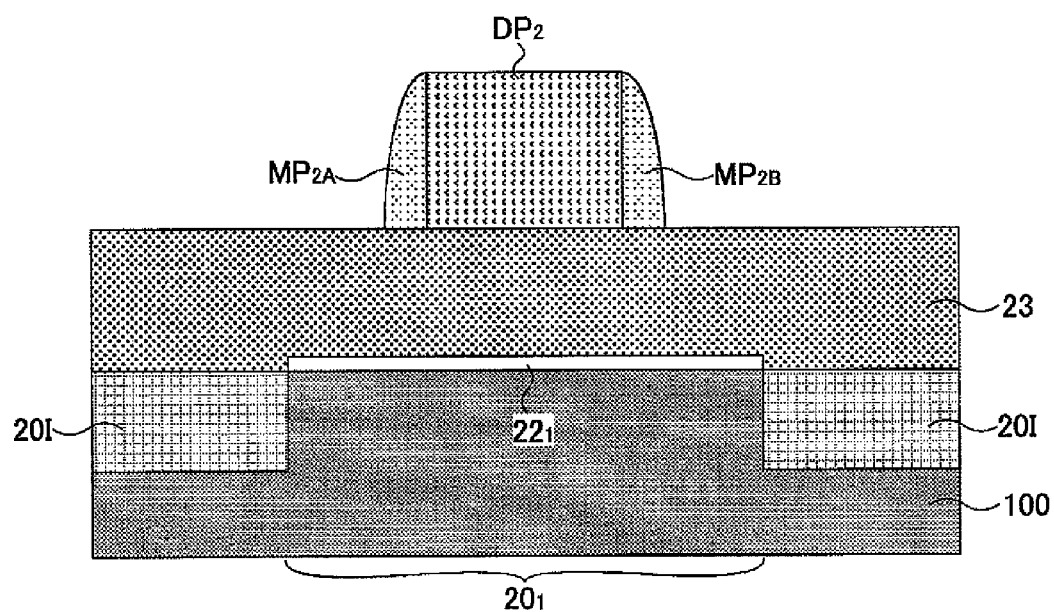

In the step of FIG. 6L, there is formed a dummy pattern $DP_2$ on the polysilicon film 23 so as to define the edge of the word line WL of the FIG. 5B, and in the step of FIG. 6M, mask patterns MP2A and MP2B are formed as the sidewall films of the dummy pattern DP2 similarly to the process of FIGS. 3A-3D. It should be noted that FIG. 6N is a cross-sectional view of the structure thus formed along a line F-F' shown in FIG. 6M.

Figure 6O:
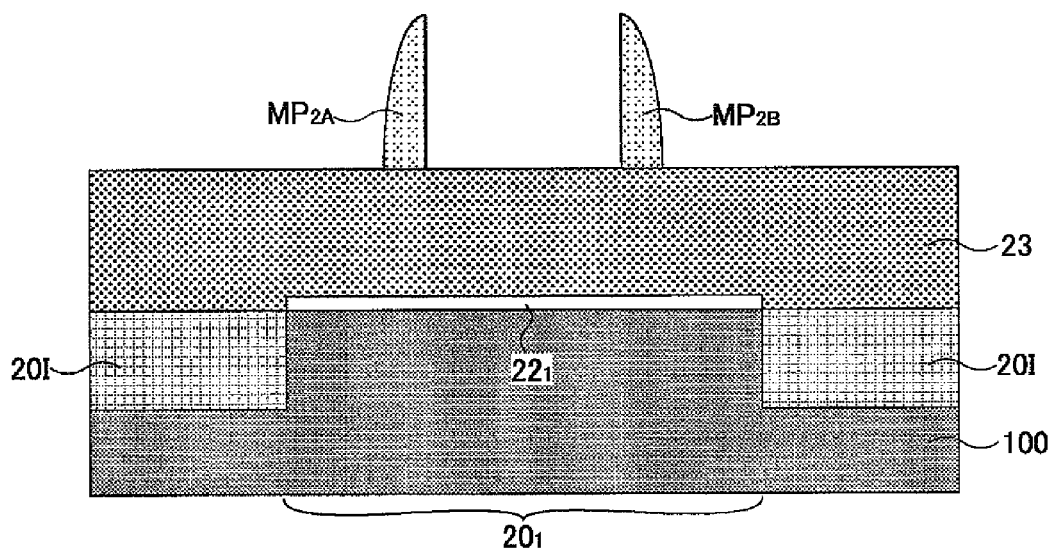
Figure 6P:
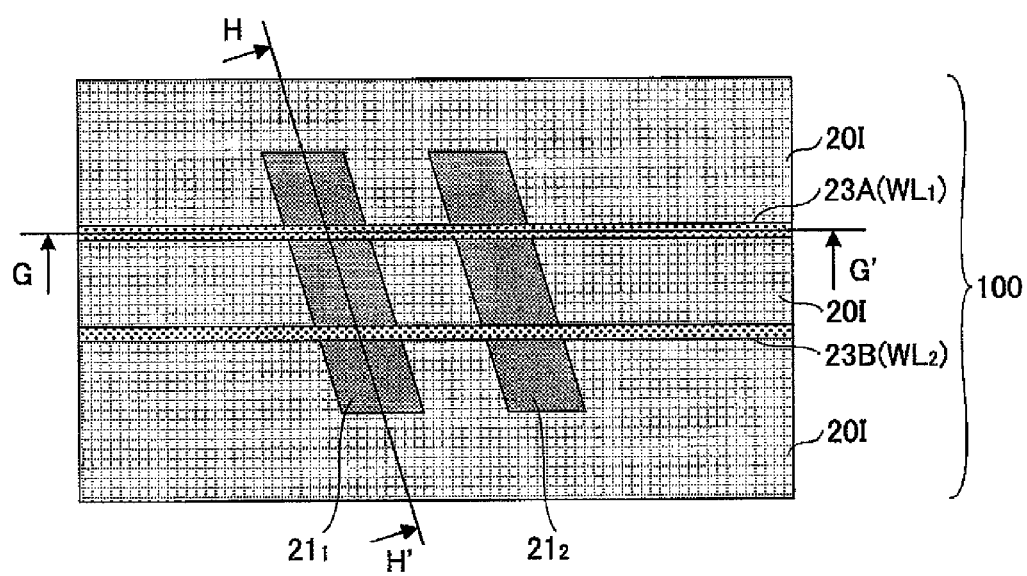
Figure 6Q:
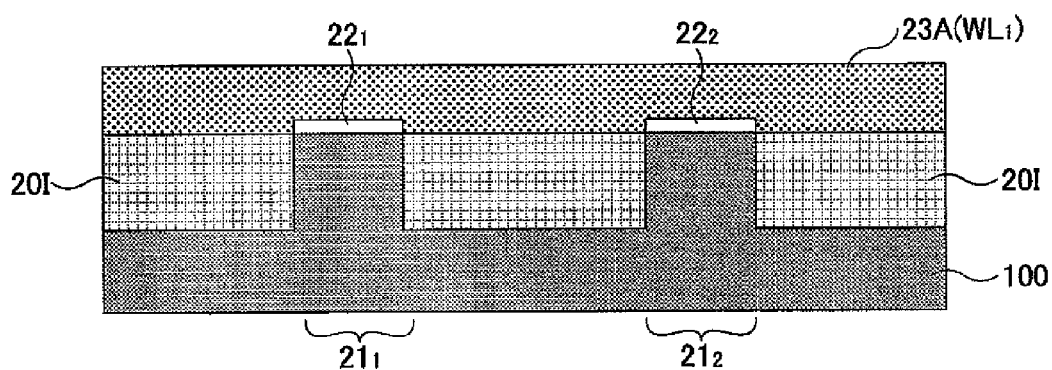
Figure 6R:
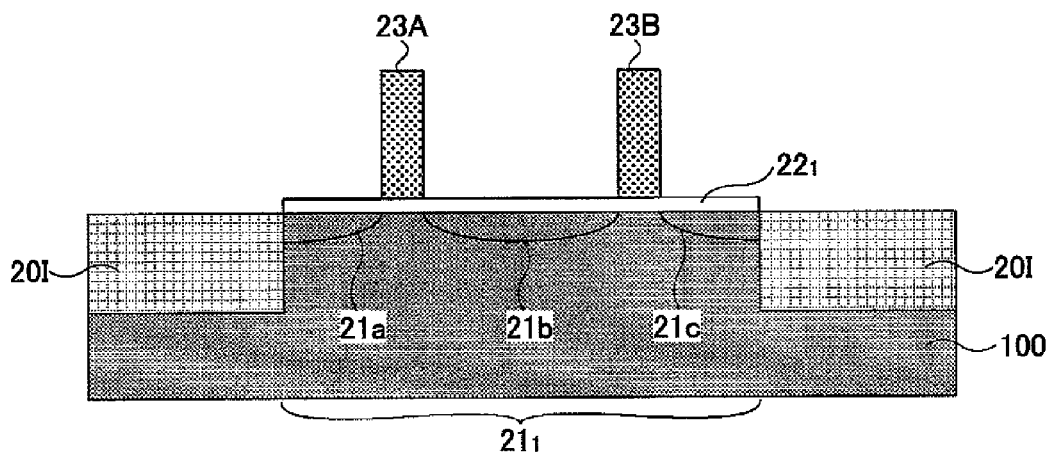

Further, in the step of FIG. 6O, the dummy pattern $DP_2$ is removed selectively, and the structure shown in FIGS. 6P-6R is obtained by patterning the polysilicon film 23 while using the remaining patterns $MP_{2A}$ and $MP_{2B}$ as a mask. Here, it should be noted that FIG. 6P shows the structure thus obtained in a plan view, while FIG. 6Q shows the same structure in a cross-sectional view taken along a line G-G' in FIG. 6P. Further, FIG. 6R shows the same structure in a cross-sectional view taken along a line H-H' in FIG. 6O.

Referring to FIGS. 6P-6R, it can be seen that the polysilicon film 23 is patterned to form the gate electrode patterns 23A and 23B, wherein diffusion regions 21a, 21b and 21c are formed in the device region $20_1$ by carrying out ion implantation process of an impurity element while using the gate electrode patterns 23A and 23B as a mask. A similar structure is formed also in the device region $20_2$.

With the present embodiment, in which the gate electrode patterns 23A and 23B are formed while using the sidewall film patterns $MP_{2A}$ and $MP_{2B}$ as a mask, it is easy to shrink the gate length of the transistors having the gate electrode patterns 23A and 23B below the resolution limit of the exposure apparatus.

Figure 6S:
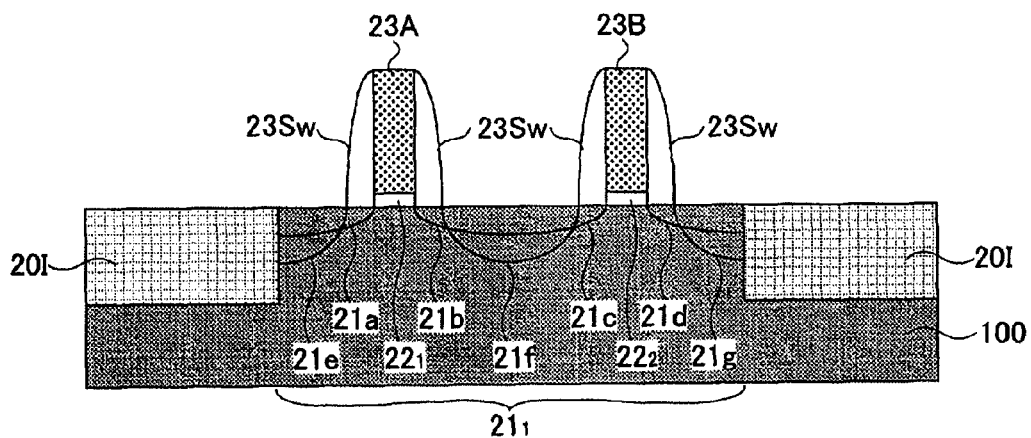

Next, in the step of FIG. 6S, there is formed a sidewall insulation film 23Sw on the sidewall surfaces of the gate electrodes 23A and 23B, and injection of impurity element is made by an ion implantation process while using the gate electrodes 23A and 23B and the sidewall insulation films 23Sw as a mask. With this, diffusion regions 21e, 21f and 21g are formed in the device region $21_1$. A similar structure is formed also in device region $21_2$.

Figure 6T:
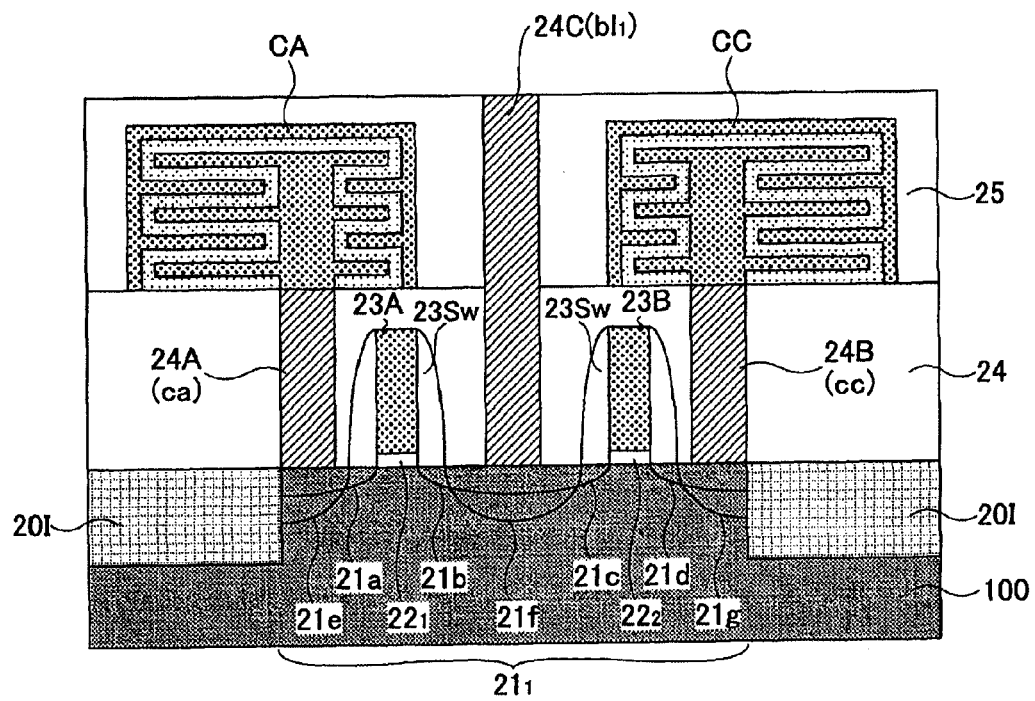

Next, in the process of FIG. 6T, an interlayer insulation film 24 is formed on the structure of FIG. 6S, contact plugs 24A and 24B are formed in the interlayer insulation film 24 in electrical connection respectively to the diffusion regions 21e and 21q in correspondence to the contact plugs ca and cc shown in FIG. 5B.

Further, the memory cell capacitors CA and CC are formed on the interlayer insulation film 24 respectively in contact with the via-plugs 24A and 24B, and a next interlayer insulation film 25 is formed on the interlayer insulation film 24 so as to cover the memory cell capacitors CA and CC.

Further, in the step of FIG. 6T, there is formed a contact plug 24C in contact with the diffusion region 21f through the interlayer insulation films 29 and 25 thus formed, in correspondence to the contact plug $bl_1$. A similar structure is formed also in the device region $21_2$.

Figure 6U:
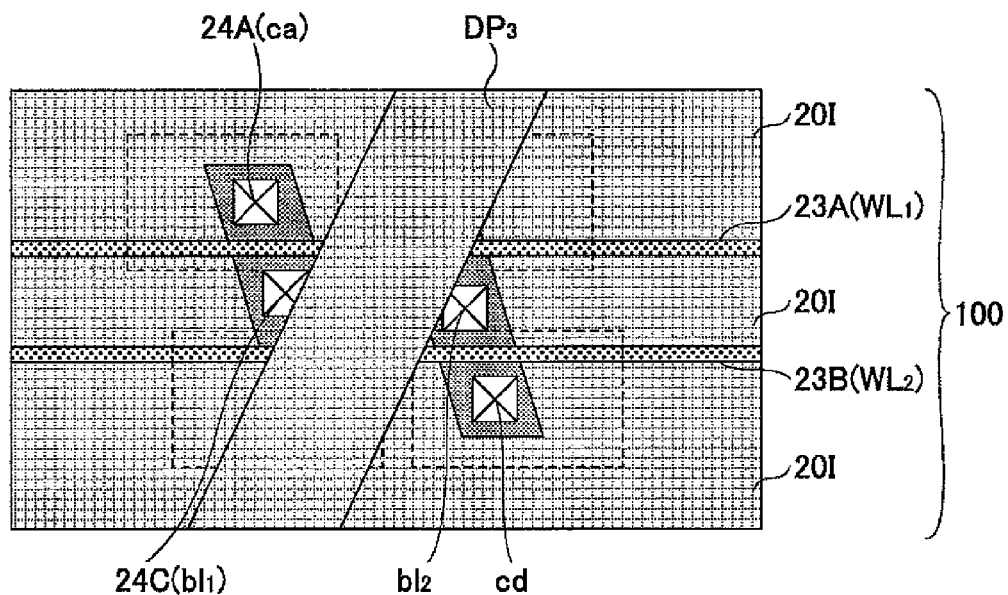
Figure 6V:
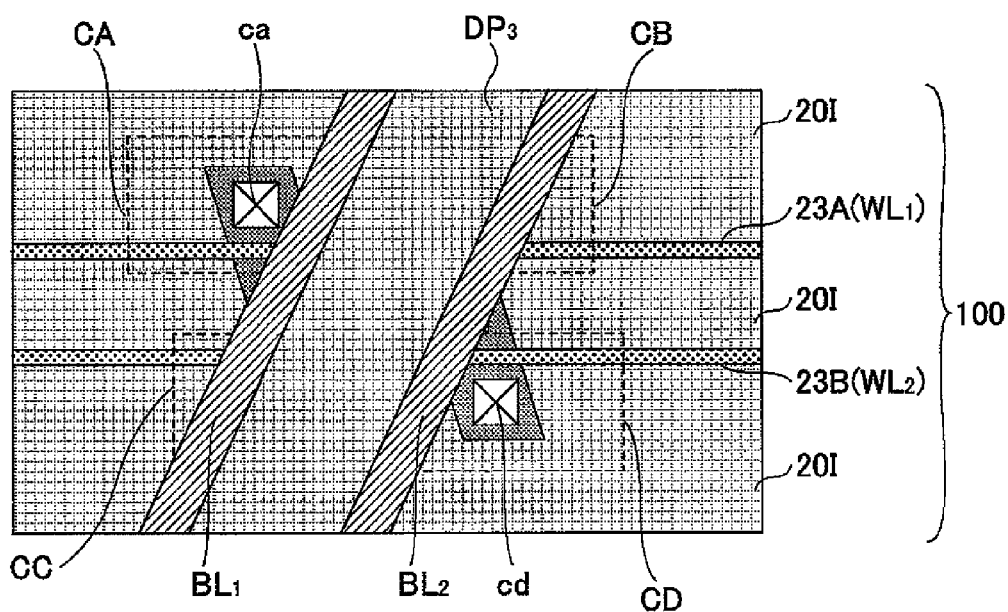

Next, in the step of FIG. 6U, a next dummy pattern DP3 is formed on the interlayer insulation film 25 in the structure of the FIG. 6S such that the edge parts thereof define the bit line patterns BL1 and BL2, and the bit line patterns BL1 and BL2 are formed in the step of FIG. 6V in the form of the sidewall films of the dummy pattern DP3 similarly to the case of FIGS. 3A-3D by carrying out the process similar to those of FIGS. 3A-3D. Here, it should be noted that the bit line patterns BL1 and BL2 respectively make a contact to the via-plugs b11 and b12 corresponding to the via-plug 24C.

Figure 6W:
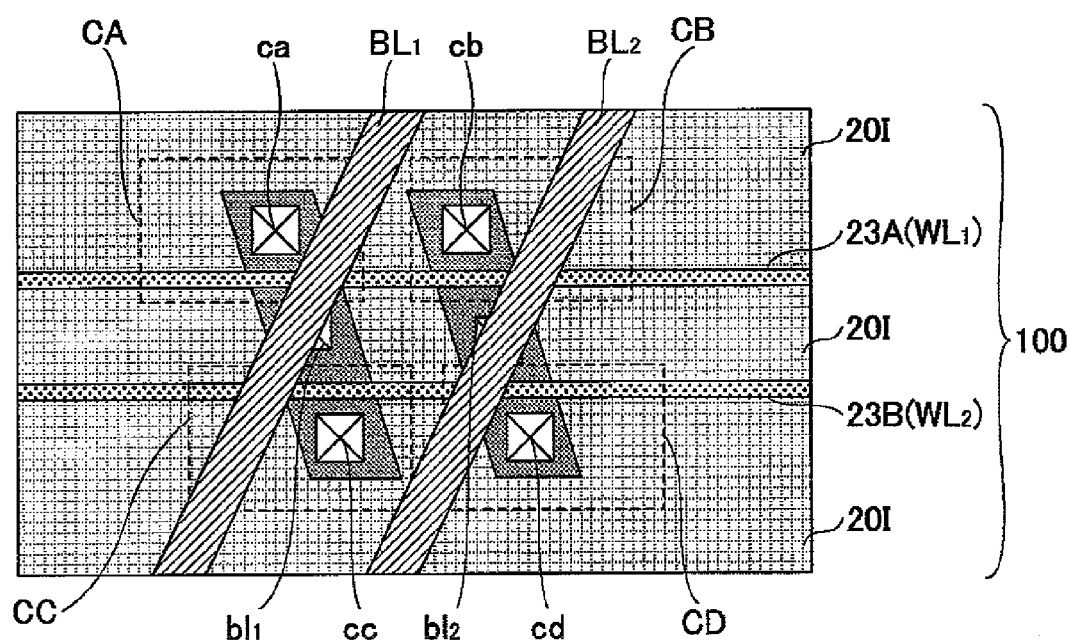

Further, in the step of FIG. 6W, the dummy pattern DP$_3$ is removed and the structure of FIG. 5B explained previously is obtained.

Thus, according to the present embodiment, it becomes possible to form the device regions $21_1$ and $21_2$, the gate electrodes 23A and 23B and the bit lines BL$_1$ and BL$_2$ to a size below the resolution limit of the exposure apparatus, and it becomes possible to fabricate a desired ultrafine semiconductor device easily and with low cost, without using expensive high resolution exposure apparatus.

Figure 7:
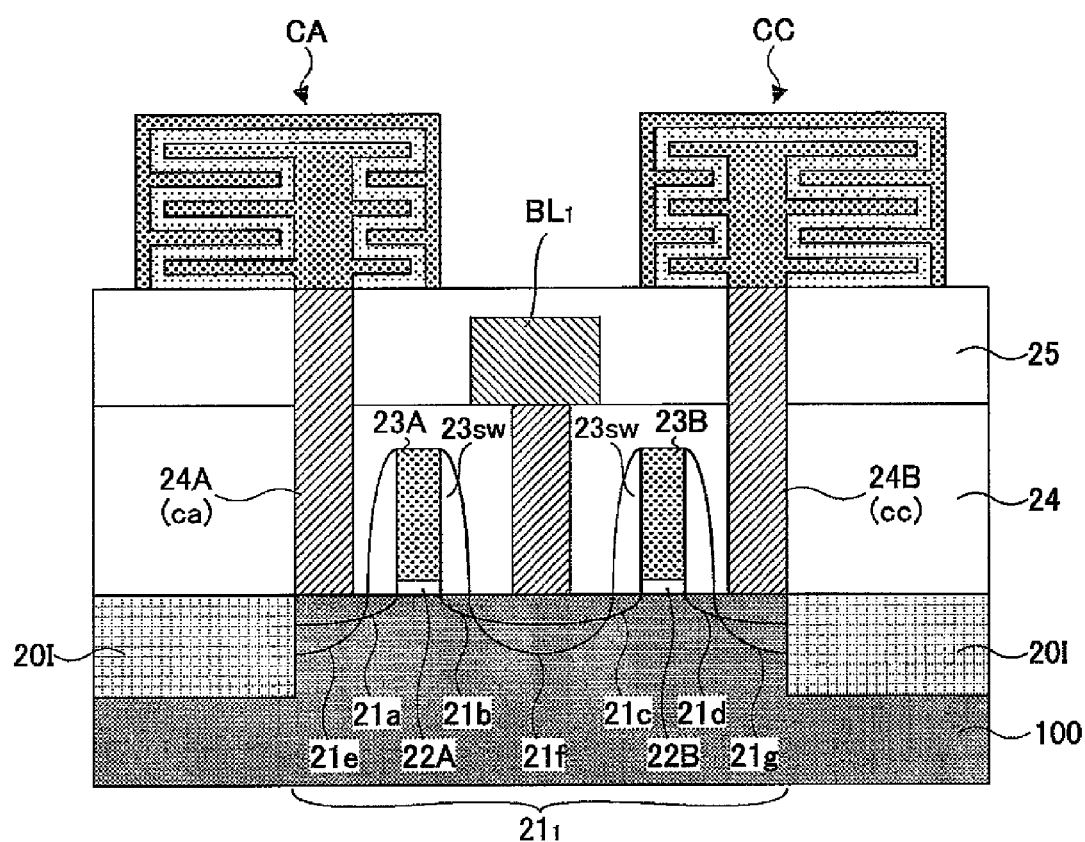
FIG. 7 is a diagram showing the constitution of a DARAM according to a modification of the first embodiment.

Incidentally, in the present embodiment, it is also possible to carry out the process steps of FIGS. 6U-6W before formation of the memory cell capacitor of FIG. 6T. In this case, the bit line patterns BL$_1$ and BL$_2$ are formed on the interlayer insulation film 24 as shown in FIG. 7, while the memory cell capacitors CA-CD are formed on the interlayer insulation film 25.

SECOND EMBODIMENT

Next, a cross bar device according to a second embodiment of the present invention will be described with reference to FIGS. 8A and 8B.

Figure 8A:
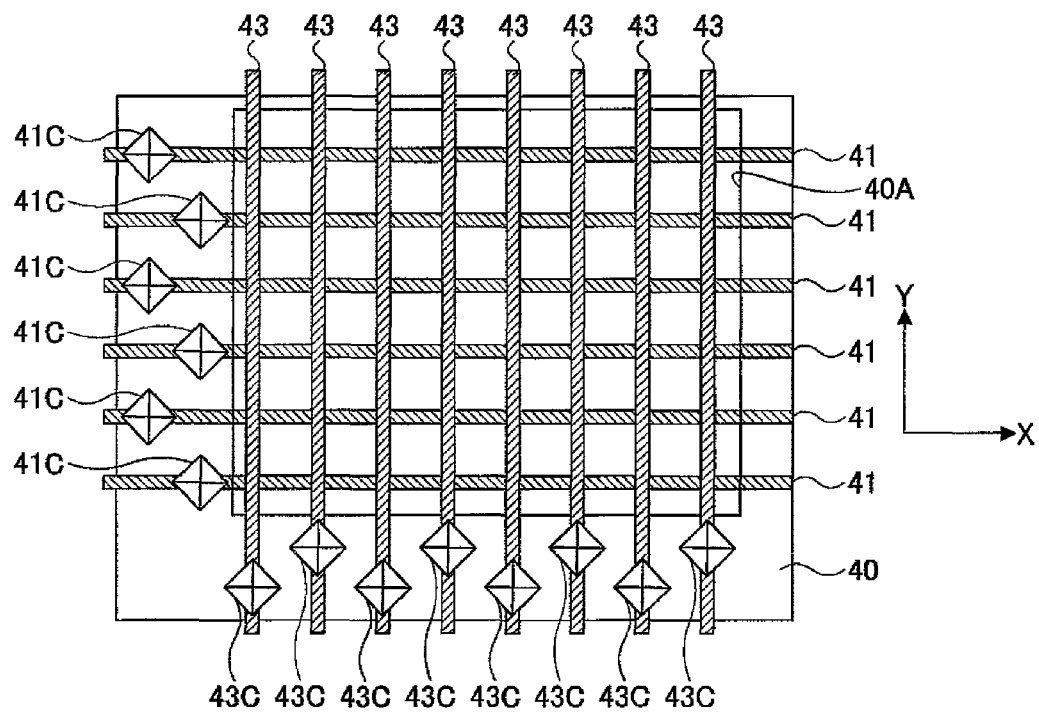
FIGS. 8A and 8B are diagrams explaining a cross-bar apparatus according to a second embodiment of the present invention.
Figure 8B:
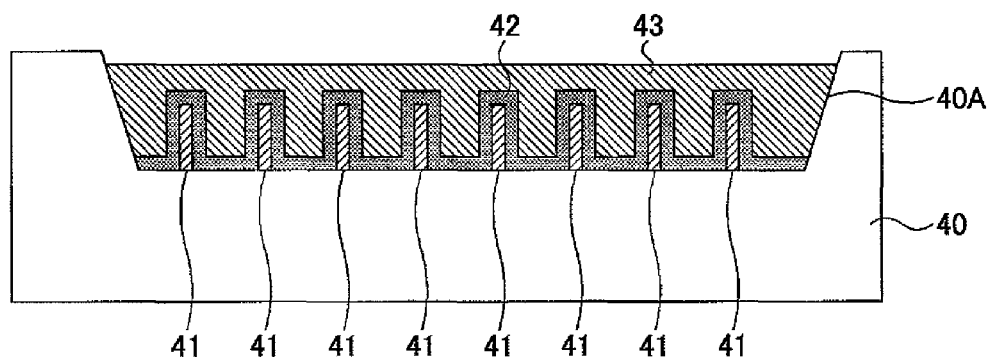

Referring to FIGS. 8A and 8B, the cross-bar device of the present embodiment comprises a number of lower electrode patterns 41 each extending in an X-direction and a number of upper electrode patterns 43 each crossing the lower electrode patterns 41 and extending in the Y-direction, wherein there is provided a functional film 42 having hysteresis such as an NiO film or an Nb$_2$O$_5$ film at the intersections of the lower electrode patterns 41 and the upper electrode patterns 43.

It should be noted that the cross-bar device is an electron device that performs a memory operation or logic operation such as AND or OR operation, depending on the memory condition of the functional film 42.

Referring to FIGS. 8A and 8B, each of the lower electrode patterns 41 is formed so as to extend through a depression 40A formed in a substrate 40 in an X-direction, and the functional film 42 is formed inside the depression 40A so as to cover the plural lower electrode patterns 41 continuously. Further, each of the upper electrode patterns 43 is extends in a Y-direction in the manner bridging across the plural lower electrodes 41 via the functional film 42.

Further, a contact plug 41C is connected to each of the lower electrode patterns 41, and a contact plug 43C is connected to each upper electrode pattern 43. As will be explained later, contact plugs 41C and 43C are formed in a staggered pattern in order to secure necessary distance between the contact plugs.

The present embodiment has the object of miniaturizing the electrode patterns 41 and 43 as much as possible by using the principle of the present invention explained with reference to FIGS. 1A-1H and FIG. 5.

Hereinafter, the fabrication process of the cross-bar device according to the present embodiment will be described.

Figure 9A:
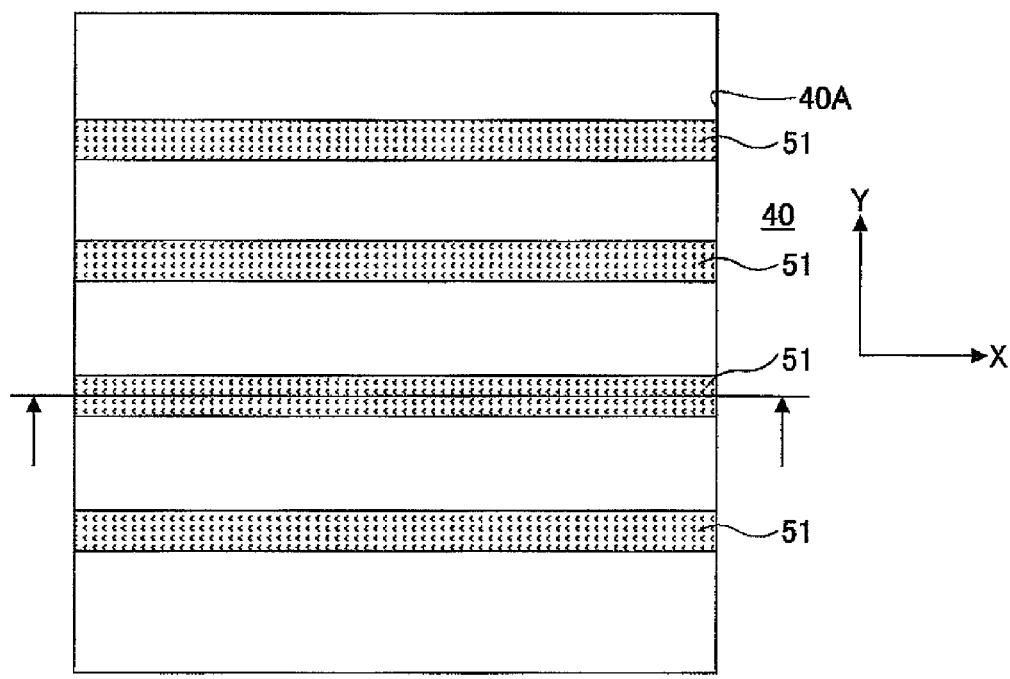
FIGS. 9A and 9B are diagrams explaining the fabrication process of the cross-bar apparatus of FIGS. 8A and 8B.
Figure 9B:
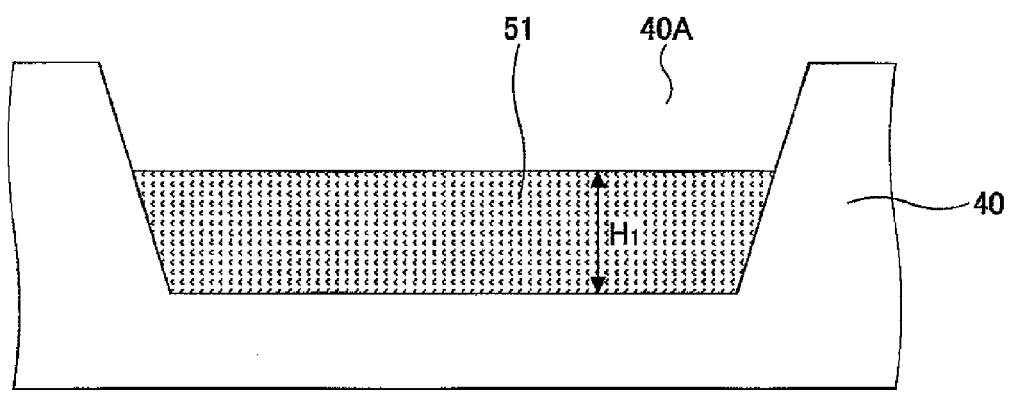

Referring to FIGS. 9A and 9B at first, there is formed a plurality of dummy patterns 51 of preferably an insulation film such as silicon oxide film or silicon nitride film or a semiconductor film such as polysilicon film, in a depression 40A surrounded by a sloped surface in the substrate 40 such that each dummy pattern 51 extends in the X-direction.

It should be noted that such a sloped surface can be formed by isotropic processing such as a wet etching process or by an anisotropic etching process that depends on the crystal surface. Alternatively, the sloped surface may be formed by a pattern transfer process such as an imprint process that imprints a shape of a three-dimensional mask.

In the illustrated example, the dummy pattern 51 has a height H$_1$ thereof smaller than the depth of the depression 40A. Here, there is no need that the dummy pattern extends beyond the depression 40A. Referring to FIG. 1B, the height H$_2$ of the dummy pattern 51 outside the depression 40A becomes zero.

It should be noted that the dummy pattern 51 of FIGS. 9A and 9B can be formed also by filling and planarizing the depression 40A with an oxide film and further patterning the same by a photolithographic process.

Figure 10:
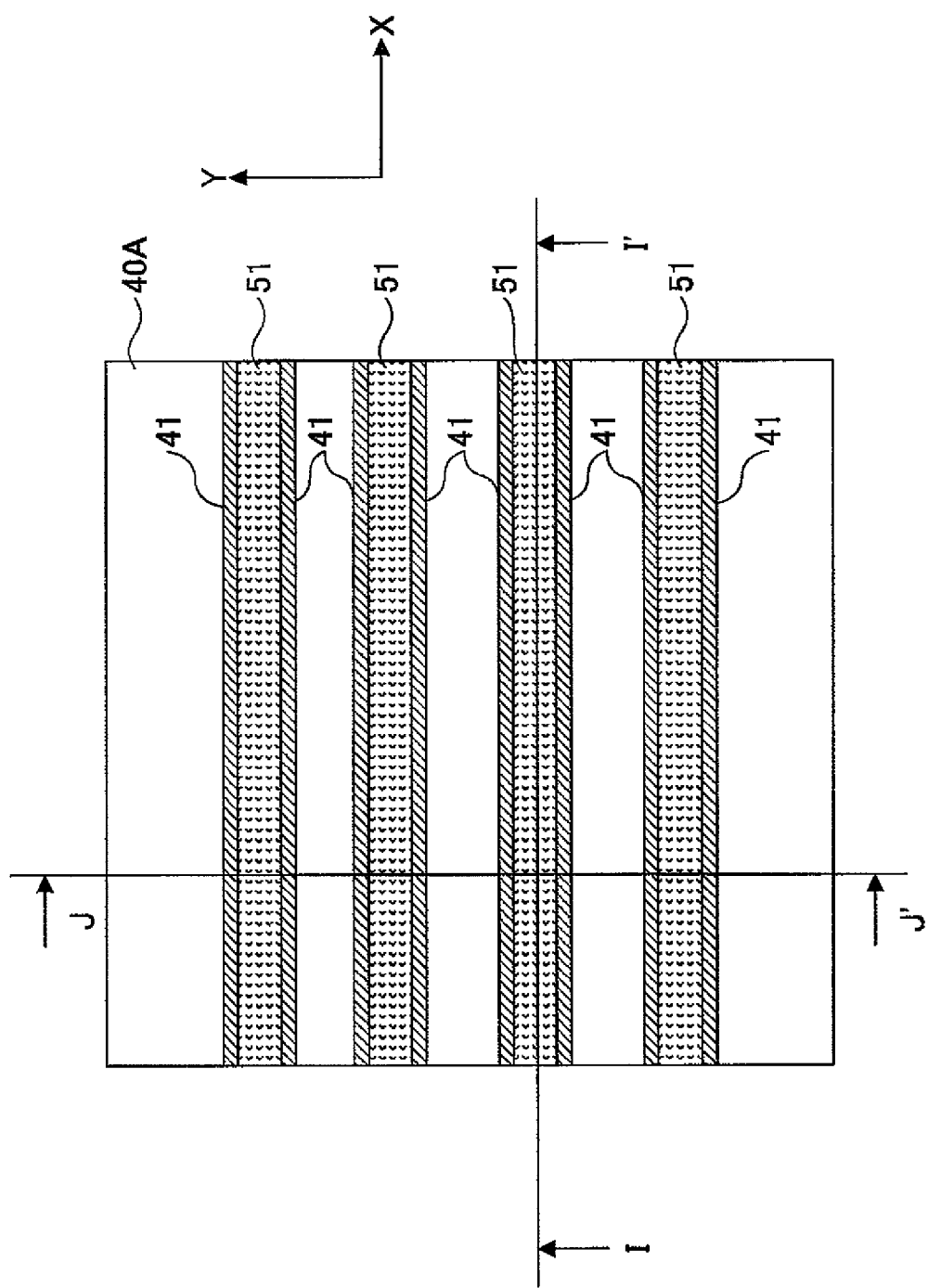
FIG. 10 is another diagram explaining the fabrication process of the cross-bar apparatus of FIGS. 8A and 8B.

Next, in the step of FIG. 10, a metal film of Al, W, Mo, Ti, or the like, or a conductor film of Pt, Au, Ag, Cu, or the like, or a conductive film such as WN, MoN, TiN, TaN, ZrN, HfN, or the like, is deposited on the structure of FIGS. 9A and 9B typically by a sputtering process or CVD process, followed by a patterning process that acts generally perpendicularly to the surface of the substrate 40. With this, the lower electrode patterns 41 are formed as the sidewall films of the dummy pattern 51.

The conductive pattern 41 can also be formed by other method.

For example, it is possible to form the conductive patterns 41 by depositing a metal film uniformly over the depression 40A at first, forming the dummy patterns 51 thereon by using a silicon oxide film, for example, forming sidewall films on the sidewall surfaces of the dummy patterns 51, and patterning the metal film by using the sidewall films as a mask, after removing the dummy patterns 51.

FIGS. 11A and 11B show the cross-sectional diagrams of FIG. 10 respectively taken along a line I-I' and a line J-J'. In FIGS. 11A and 11B, it should be noted that the sidewall film 41 is removed in the part of the depression 40A forming the sloped surface.

Figure 12A:
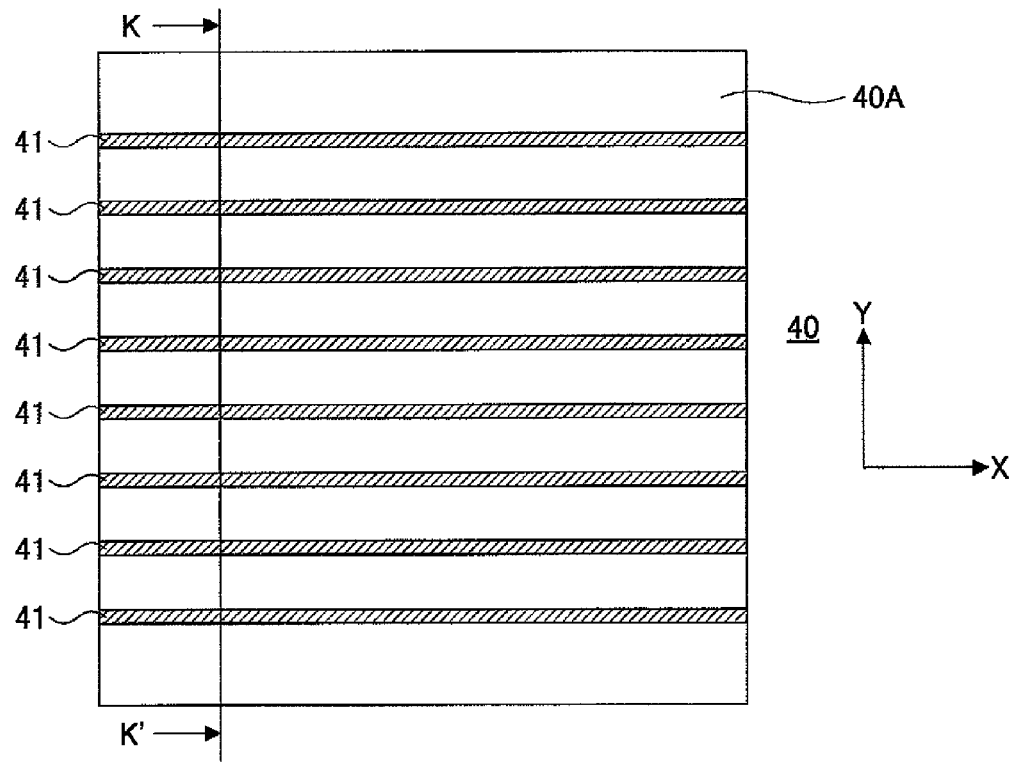
FIGS. 12A and 12B are further diagrams explaining the fabrication process of the cross-bar apparatus of FIGS. 8A and 8B.
Figure 12B:
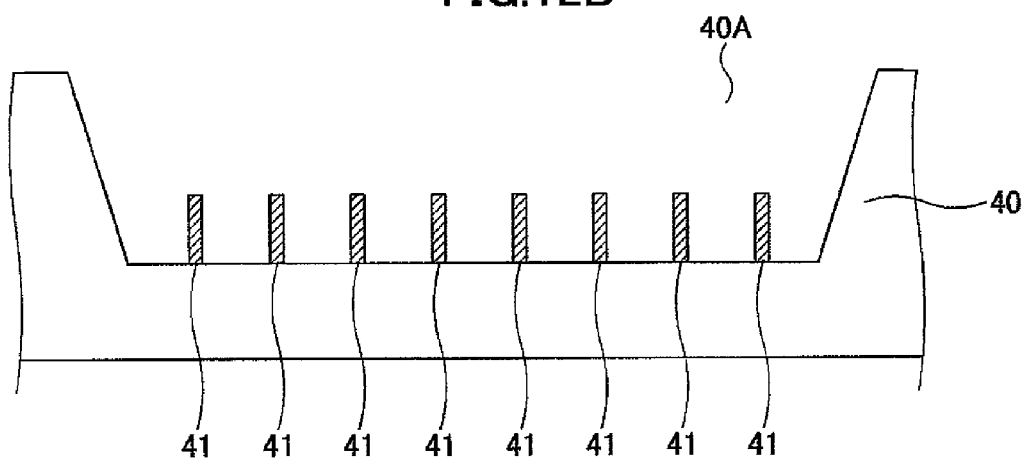
Figure 13A:
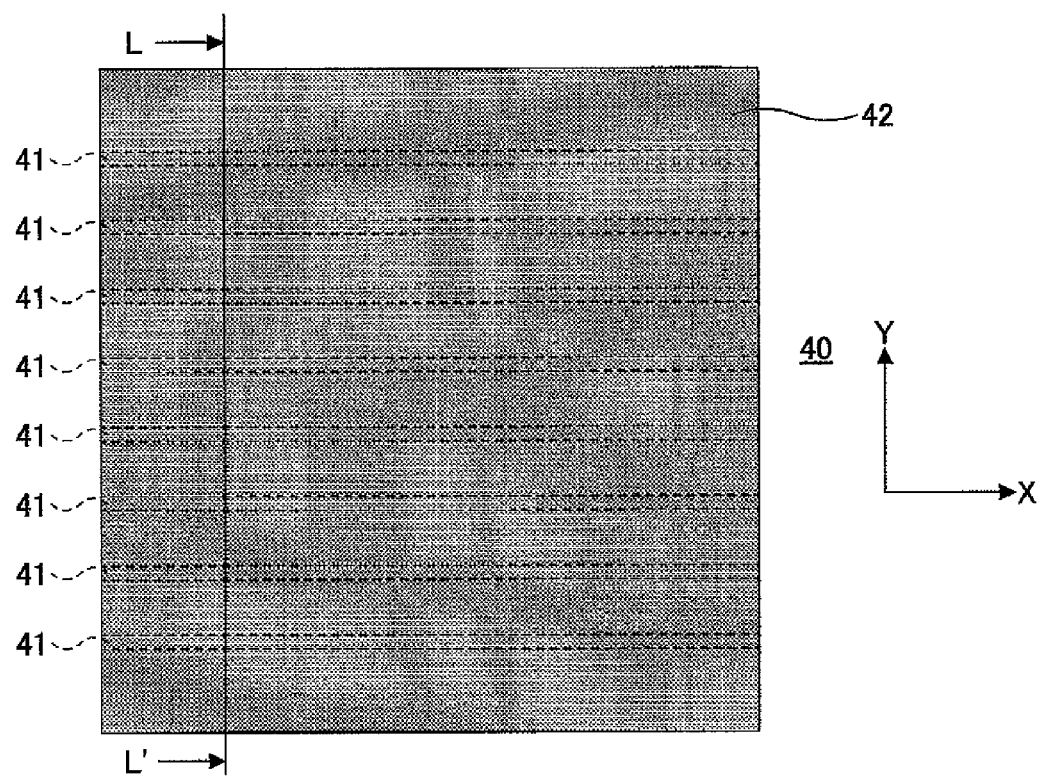
FIGS. 13A and 13B are further diagrams explaining the fabrication process of the cross-bar apparatus of FIGS. 8A and 8B.
Figure 13B:
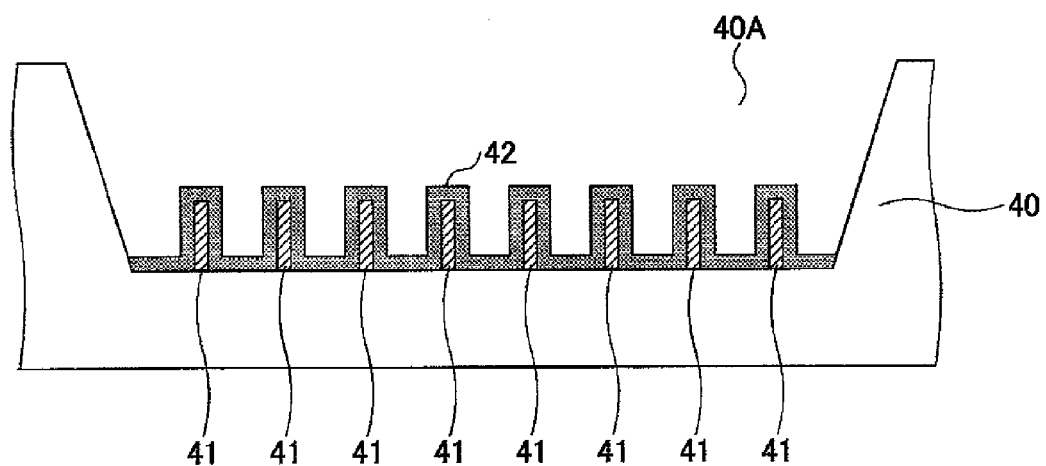

Next, in the step of FIGS. 12A and 12B, the dummy pattern 51 is removed by a selective etching process, and the functional film 42 is deposited in the step of FIGS. 13A and 13B on the structure of FIGS. 12A and 12B generally with a uniform film thickness typically by a sputtering process. Here, it should be noted that FIG. 12B is a cross-sectional view taken along a line K-K' in the plan view of FIG. 12A, while FIG. 13B is a cross-sectional view taken along a line L-L' in the plan view of FIG. 13A.

Figure 14:
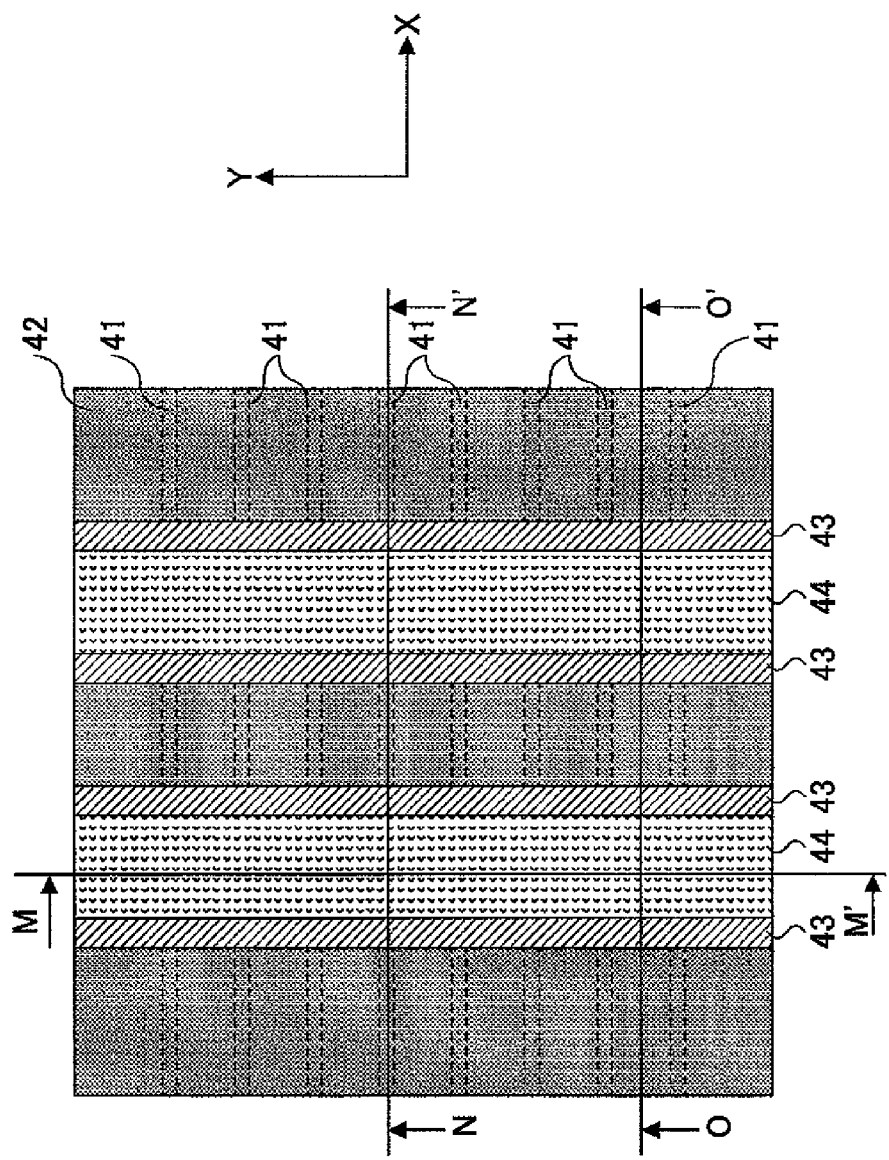
FIG. 14 is a further diagram explaining the fabrication process of the cross-bar apparatus of FIGS. 8A and 8B.

Next, in the step of FIG. 14, a dummy pattern 44 extending in the Y direction is formed on the structure of the FIGS. 13A and 13B, and a metal film such as Al, W, Mo, Ti, or the like, a metal film of Pt, Au, Cu, Ag, or the like, or a conductor film of other conductive materials such as, WN, MoN, TiN, TaN, ZrN, HfN, or the like, is formed as the upper electrode pattern 43 in the form of sidewall films.

For the foregoing conductive material, it is possible to use a metal element M itself, a nitride M$_x$N$_y$ ($x \geq 0$, $y \geq 1$) thereof, a silicide M$_x$Si$_y$ ($x \geq 0$, $y \geq 1$) thereof, a silicide nitride M$_x$Si$_y$N$_z$ ($x \geq 0$, $y \geq 1$, $z \geq 1$) thereof, or the like. For the metal element M, it is possible to use any of Al, Cu, Ag, Au, Ti, Co, Ni, W, Mo, Ta, Nb, Zr, Hf, V, Y, Zn, and Mn.

Figure 15A:
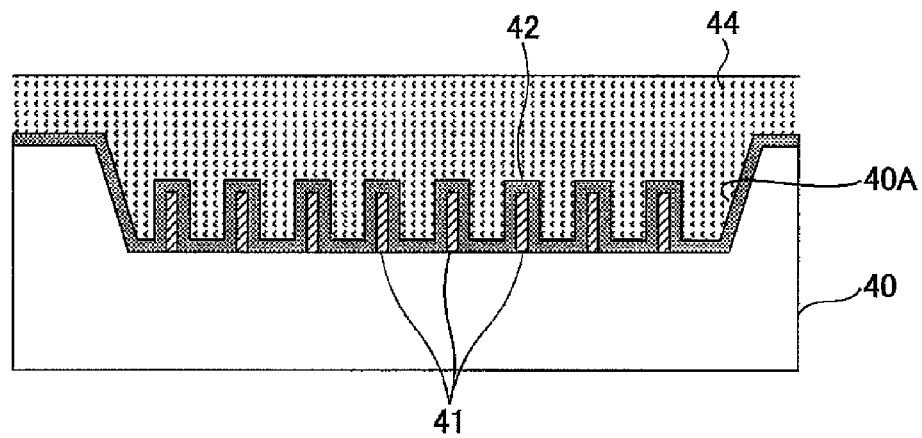
FIGS. 15A-15C are further diagrams explaining the fabrication process of the cross-bar apparatus of FIGS. 8A and 8B.
Figure 15B:
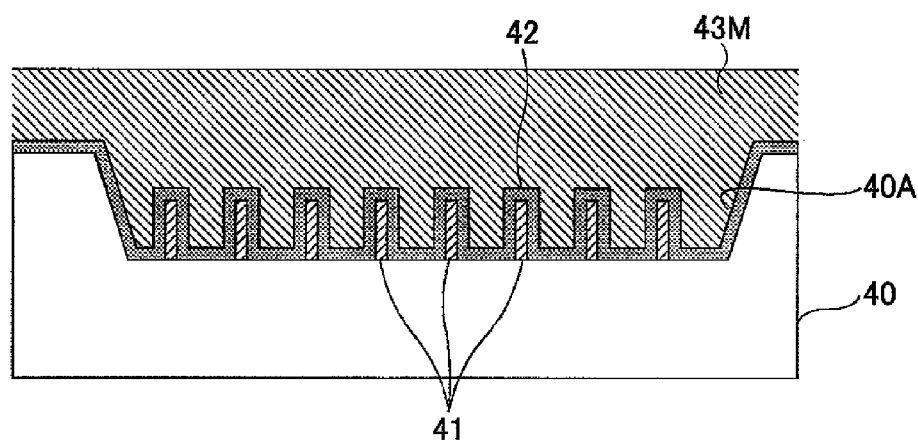
Figure 15C:
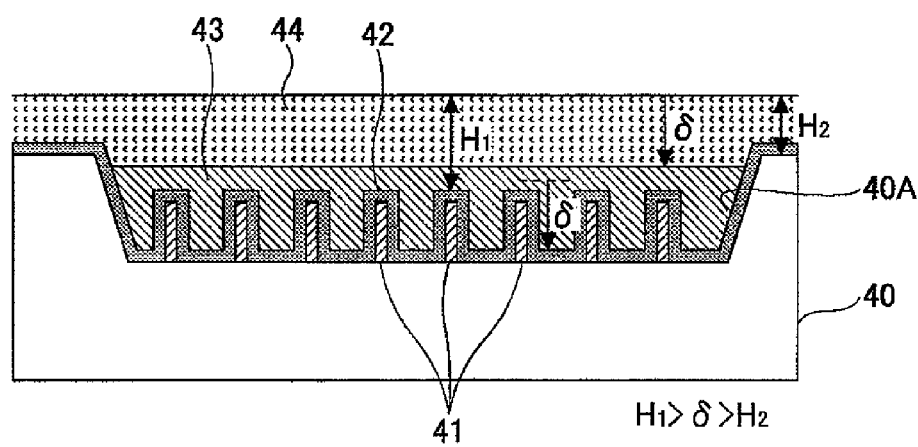

FIGS. 15A-15C are diagrams showing the formation process of the structure of the FIGS. 13A and 13B for a cross-sectional view taken along a line M-M' of FIG. 14.

Referring to FIG. 15A, a dummy film of a low melting point material such as BPSG first is formed so as to fill the depression 40A of the substrate 40, followed by planarization by reflowing. The dummy patterns 44 are formed as a result of patterning of the dummy film thus formed. Here, the planarization process of the dummy film is not limited to the reflowing process. Thus, the planarization process may be conducted also by a CMP process.

Next, in the process of FIG. 15B, a metal film 43M constituting the upper electrode pattern 43 is formed on the structure of FIG. 15A so as to cover the dummy patterns 44 with a shape conformal to the cross-sectional shape of the dummy patterns 44, and the upper electrode patterns 43 are formed in the step of FIG. 15C by applying an anisotropic etching process acting generally perpendicularly to the substrate 40 to the metal film 43M with a depth δ.

Thereby, it should be noted that the etching depth δ is set to be larger than the height $H_2$ of the dummy pattern 22 on the substrate 40 in the outer region outside of the depression 40A, and as a result, the dummy patterns 44 are disconnected at the edge part of the depression 40A. In other words, no circuitous pattern is formed for the dummy patterns 44 with the present embodiment.

Because the height $H_1$ of each dummy pattern 44 on the lower electrode 44 as measured from the top surface of the functional film 42 is set larger than the foregoing height $H_2$, and because the height $H_1$ is set larger than the etching depth δ, there arises no problem such as disconnection of the upper electrode pattern 43 in the part extending over the lower electrode pattern 41.

Further, while the metal film 43M is formed so as to cover the lower electrode 41 via the functional film 42, the problem that the functional film 42 is removed from the surface of the lower electrode pattern as a result of the etching and the adjacent upper electrode patterns 43 cause short circuit via the underlying lower electrode pattern 41 is avoided by setting the etching depth δ such that the etching process does not reach the highest surface level of the functional film 42.

Figure 16A:
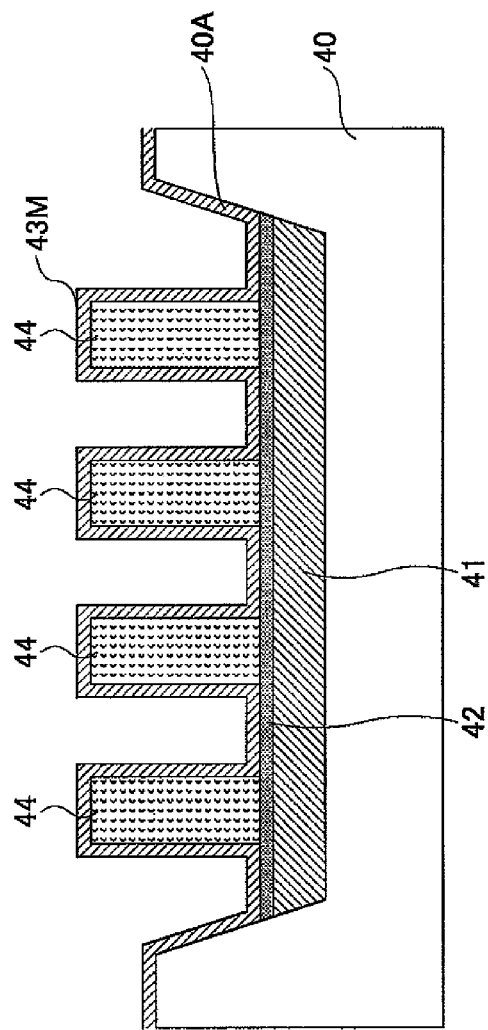
FIGS. 16A and 16B are further diagrams explaining the fabrication process of the cross-bar apparatus of FIGS. 8A and 8B.
Figure 16B:
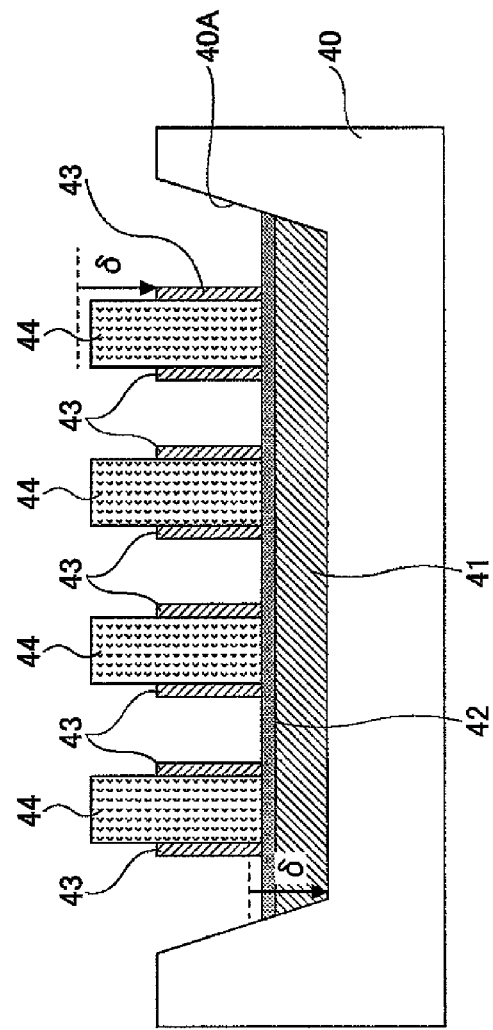

FIGS. 16A and 16B are diagrams showing the formation step of the structure of FIG. 14 in the cross-section taken along a line N-N' shown in FIG. 14.

Referring to FIG. 16A, the dummy patterns 44 are formed on the lower electrode pattern 41 via the functional film 42 in this cross-section, and it can be seen that the metal film 43M is formed with a shape conformal to the cross-sectional shape of the dummy patterns 44 in a manner to cover the exposed surface of the functional film 42 and the sidewall surface and the top surface of the dummy patterns 44.

Thus, by applying an anisotropic etching process acting generally perpendicularly to the surface of the substrate 40 to the metal film 43M in the step of FIG. 16B with a depth δ set sufficient for removing the part of the metal film 43M covering the sidewall surfaces of the lower electrode 41 via the functional film 42, the upper electrode patterns 43 are formed with mutual separation.

FIGS. 17A and 17B are diagrams showing the process of forming the structure of FIG. 14 in the cross-section taken along a line O-O' shown in FIG. 14.

Referring to FIG. 17A, the dummy pattern 44 is formed on the bottom surface of the depression 40A via the functional film 42 in this cross-section with the height larger than the height shown in the cross-section of FIGS. 16A and 16B. Further, the metal film 43 is formed with a shape conformal to the shape of the dummy patterns 44 and covers the exposed surface of the functional film 42 and the sidewall surface and the top surface of the dummy patterns 44.

Thus, by etching the metal film 43M in the step of FIG. 17B by an anisotropic etching process acting generally perpendicularly to the surface of the substrate 40 with the depth δ, it becomes possible to form the upper electrode patterns 43 in mutually independent state.

In this manner, the electron device having a lattice-shaped electrode pattern shown in FIGS. 8A and 8B is obtained.

Figure 18:
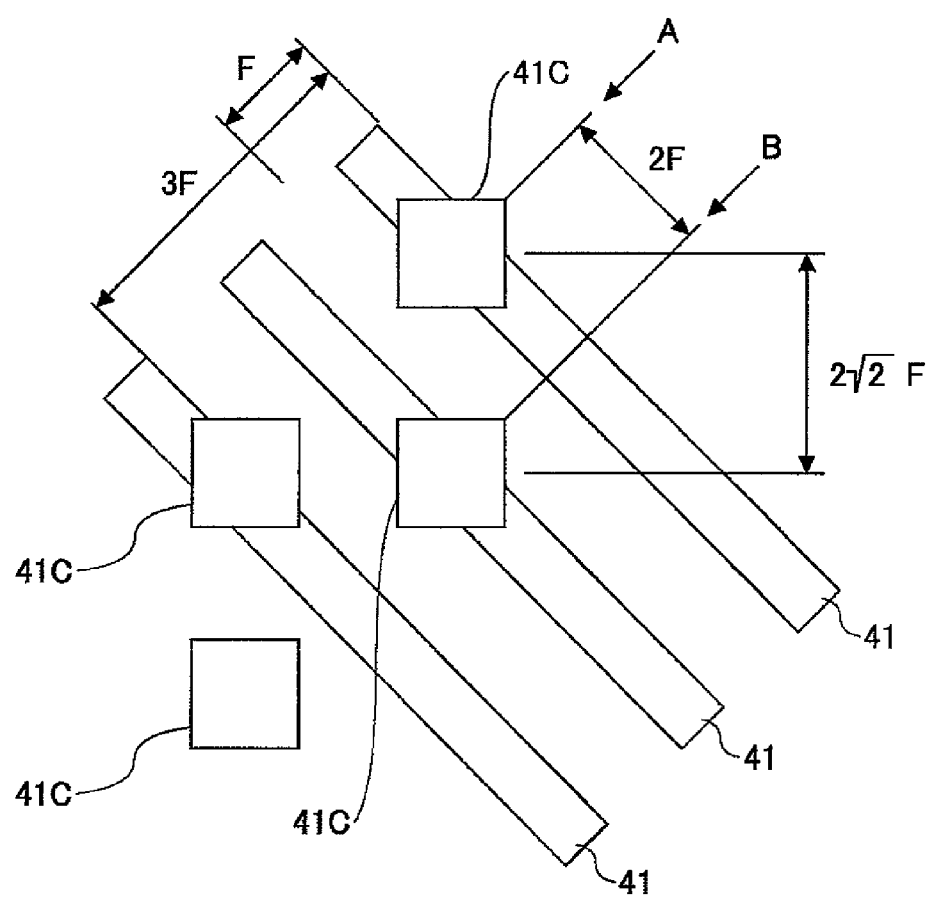
FIG. 18 is a diagram explaining the formation of a contact plug in the cross-bar apparatus of FIGS. 8A and 8B.

FIG. 18 is a diagram showing the formation of contact plugs 41C on the lower electrode patterns 41 shown in FIG. 8A, wherein it should be noted that similar formation of the contact plugs is achieved also for the contact plugs 43C formed on the upper electrode patterns 43. It should be noted that FIG. 21 shows the part including the contact plugs 41C of FIG. 8A with rotation of 45 degrees on the plane of the drawing.

Referring to FIG. $21_1$ the lower electrode patterns 41 are formed, in the case the dummy patterns 44 are formed with repetition pitch of 3F, F being the design rule, by the conductor patterns each having a width smaller than the design rule f, while the contact plugs 41C themselves are formed with the design rule F.

Thus, with the present embodiment, in order to secure sufficient separation between the contact plugs contacted with the densely arrayed fine patterns, the contact plugs 41C are formed in the form of two contact hole arrays A and B separated with each other by a separation 2F and forming a perpendicular angle with regard to each of the lower electrode patterns 41. Between the contact hole arrays A and B, the contact holes 41C displaced by one-half period.

With such a construction, a separation of 2√2F, and it becomes possible to form the contact holes without causing short circuit.

While it has been described heretofore that the X-direction and Y-direction are in a perpendicular relationship, the present invention is effective also in the cases in which the X-direction and the Y-direction cross with each other with a non-perpendicular angle.

Further, while the present invention has been explained for preferred embodiments, it should be noted that the present invention is by no means limited to such particular embodiments but the various variations and modifications may be made within the scope of the present invention.

What is claimed is:

1. A method for fabricating a semiconductor device, comprising:

forming a dummy film over a substrate such that said dummy film covers a device region of said substrate and an outer region of said substrate outside said device region;

forming a dummy pattern line by patterning said dummy film such that said dummy pattern line has a first height in said device region and a second height smaller than said first height in said outer region;

forming another film over said substrate such that said another film covers said dummy pattern line in said device region and in said outer region; and applying an anisotropic etching process to said substrate such that a surface of said substrate is exposed in said device region and in said outer region, the anisotropic etching process being conducted in a direction perpendicular to the surface of said substrate to form first and second patterns in said device region respectively along a first sidewall surface of said dummy pattern line and a second sidewall surface of said dummy pattern line opposite to said first sidewall surface and completely remove said another film in said outer region to an amount exceeding the second height of the dummy pattern line; and forming a semiconductor element in said device region by using said first and second patterns.

2. The method as claimed in claim 1, wherein there is formed a depression on said substrate in correspondence to said device region, and wherein said dummy film is formed in said depression and has a substantially uniform flat surface over said device region and said outer region.

3. The method as claimed in claim 2, wherein said dummy film fills said depression.

4. The method as claimed in claim 1, wherein there is formed a depression on said substrate in correspondence to said device region, and wherein said dummy film fills a bottom part of said depression partially, said dummy film having a flat surface in said device region.

5. The method as claimed in claim 4, wherein said depression is defined by a sidewall surface forming an oblique angle with respect to a top surface of said substrate.

6. The method as claimed in claim 1,
wherein said step of pattering said dummy film includes the step of:
forming said dummy pattern line over said substrate with said first height over said device region and said outer region; and
reducing said height of said dummy pattern line in said outer region.

7. The method as claimed in claim 1, wherein said first and second patterns constitute a functional part of said semiconductor element.

8. The method as claimed in claim 1, wherein said first and second patterns is used as a mask.

9. The method as claimed in claim 8, wherein said another film comprises any of an insulation film, a semiconductor film and a conductor film.

10. The method as claimed in claim 1, wherein said another film in said outer region is removed and said first and second patterns in said device region are formed after the anisotropic etching process is applied to said substrate.

* * * * *